(12) United States Patent
Fuergut et al.

(10) Patent No.: US 11,728,250 B2
(45) Date of Patent: Aug. 15, 2023

(54) SEMICONDUCTOR PACKAGE WITH CONNECTION LUG

(71) Applicant: Infineon Technologies Austria AG, Villach (AT)

(72) Inventors: Edward Fuergut, Dasing (DE); Martin Gruber, Schwandorf (DE); Herbert Hopfgartner, Rothenthurn (AT); Bernd Schmoelzer, Radenthein (AT)

(73) Assignee: Infineon Technologies Austria AG, Villach (AT)

( * ) Notice: Subject to any disclaimer, the term of this patent is extended or adjusted under 35 U.S.C. 154(b) by 259 days.

(21) Appl. No.: 17/325,422

(22) Filed: May 20, 2021

(65) Prior Publication Data

US 2022/0375830 A1 Nov. 24, 2022

(51) Int. Cl.
*H01L 23/495* (2006.01)
*H01L 23/31* (2006.01)
(Continued)

(52) U.S. Cl.
CPC .... *H01L 23/49503* (2013.01); *H01L 23/3107* (2013.01); *H01L 23/49575* (2013.01);
(Continued)

(58) Field of Classification Search
CPC ........... H01L 23/49503; H01L 23/3107; H01L 23/49575; H01L 24/48; H01L 25/072; H01L 2224/48139; H01L 2224/48245; H01L 21/561; H01L 25/115; H01L 24/27; H01L 24/29; H01L 24/32; H01L 24/37; H01L 24/73; H01L 24/83; H01L 2224/29101; H01L 24/38; H01L 24/40; H01L 24/84; H01L 24/06; H01L 24/49; H01L 24/92; H01L 24/97; H01L 2224/0603; H01L 2224/27318; H01L 2224/2732; H01L 2224/32245; H01L 2224/40137; H01L 2224/40139; H01L 2224/40245; H01L 2224/48091;
(Continued)

(56) References Cited

U.S. PATENT DOCUMENTS 9,041,172 B1 5/2015 Niu et al.
2010/0109135 A1 5/2010 Jereza

FOREIGN PATENT DOCUMENTS

EP 2824696 A1 1/2015
EP 3584832 A1 12/2019

*Primary Examiner* — Robert G Bachner
(74) *Attorney, Agent, or Firm* — Murphy, Bilak & Homiller, PLLC

(57) ABSTRACT

A semiconductor package includes a first die pad, a first semiconductor die mounted on the first die pad, an encapsulant body of electrically insulating material that encapsulates first die pad and the first semiconductor die, a plurality of package leads that each protrude out of a first outer face of the encapsulant body, a connection lug that protrudes out of a second outer face of the encapsulant body, the second outer face being opposite from the first outer face. The first semiconductor die includes first and second voltage blocking terminals. The connection lug is electrically connected to one of the first and second voltage blocking terminals of the first semiconductor die. A first one of the package leads is electrically connected to an opposite one of the first and second voltage blocking terminals of the first semiconductor die that the first connection lug is electrically connected to.

20 Claims, 46 Drawing Sheets

(51) Int. Cl.
 *H01L 25/07* (2006.01)
 *H01L 23/00* (2006.01)
(52) U.S. Cl.
 CPC ............ *H01L 24/48* (2013.01); *H01L 25/072* (2013.01); *H01L 2224/48139* (2013.01); *H01L 2224/48245* (2013.01)
(58) Field of Classification Search
 CPC . H01L 2224/48111; H01L 2224/48247; H01L 2224/4903; H01L 2224/49111; H01L 2224/73221; H01L 2224/73265; H01L 2224/83192; H01L 2224/83801; H01L 2224/92247; H01L 2924/00014; H01L 2924/13055; H01L 2924/13091; H01L 2924/181; H01L 23/49562; H01L 23/49565; H01L 23/49537
 See application file for complete search history.

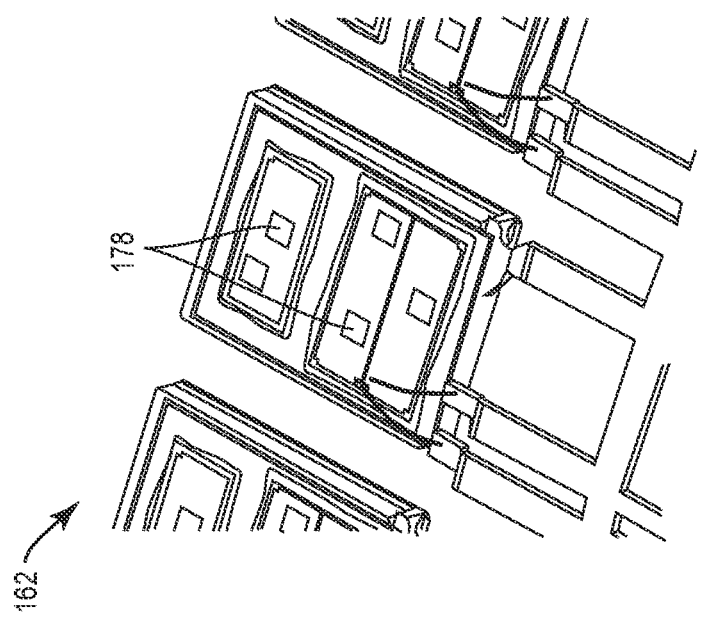
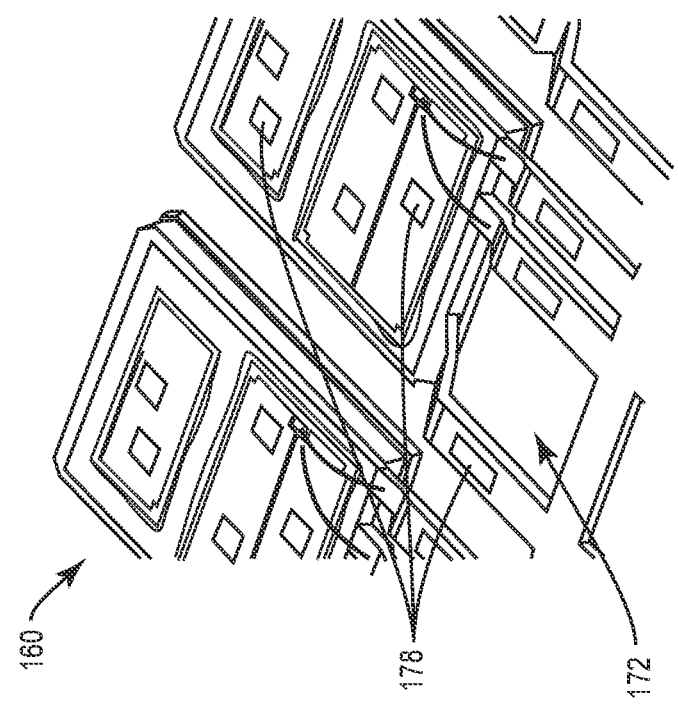
Fig. 5D

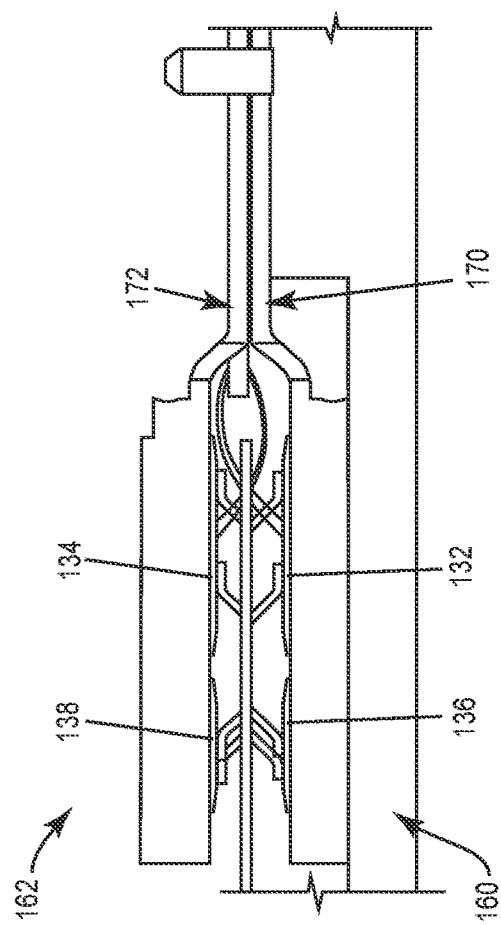
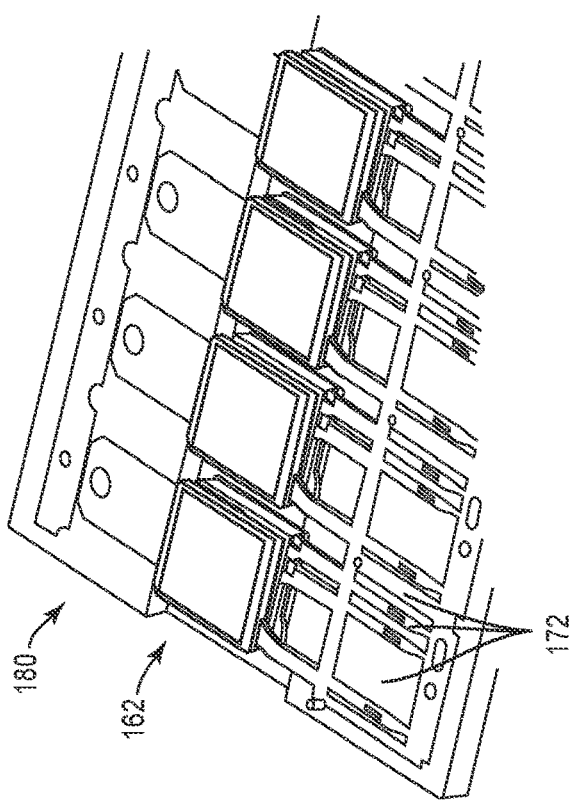
Fig. 51

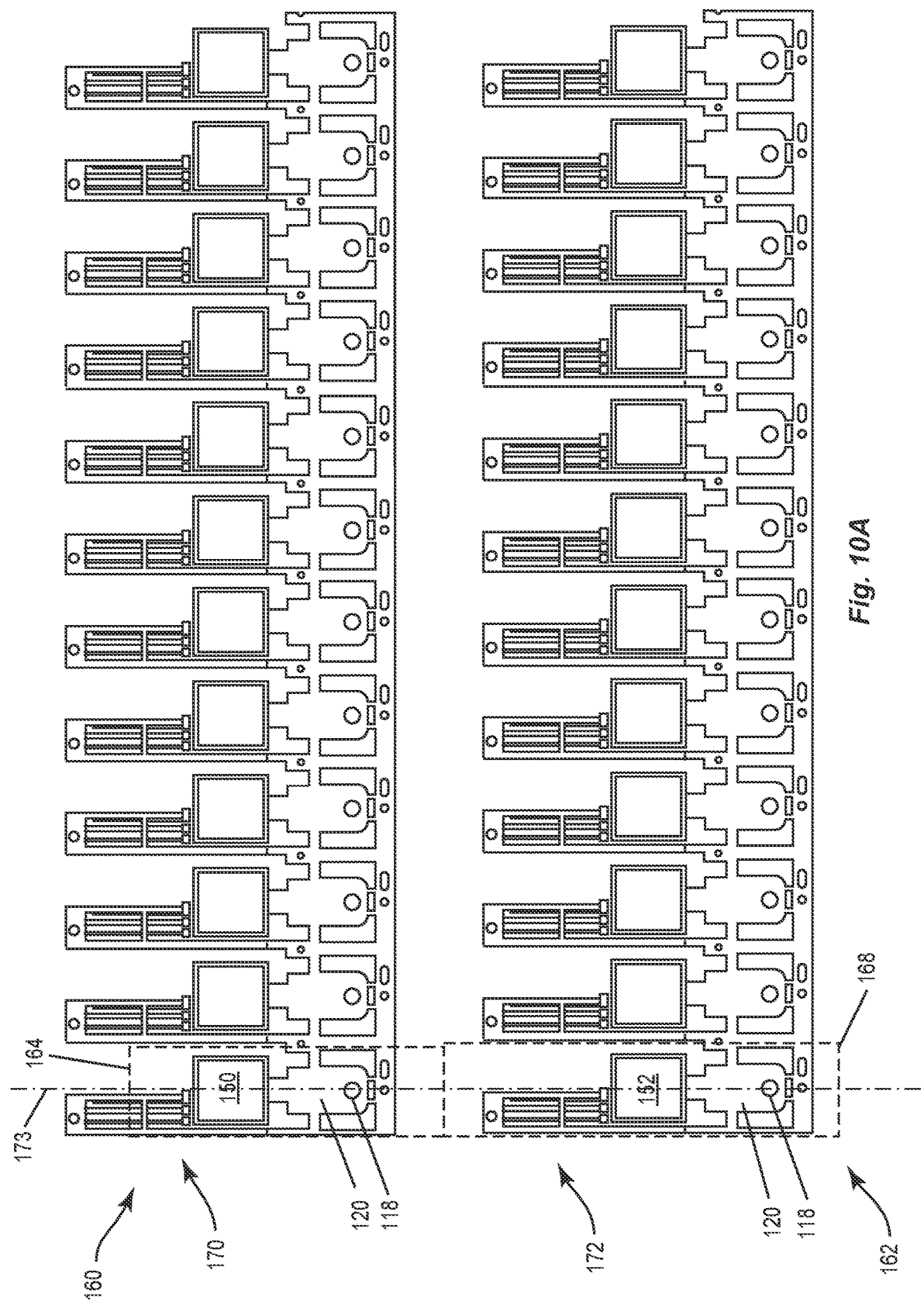

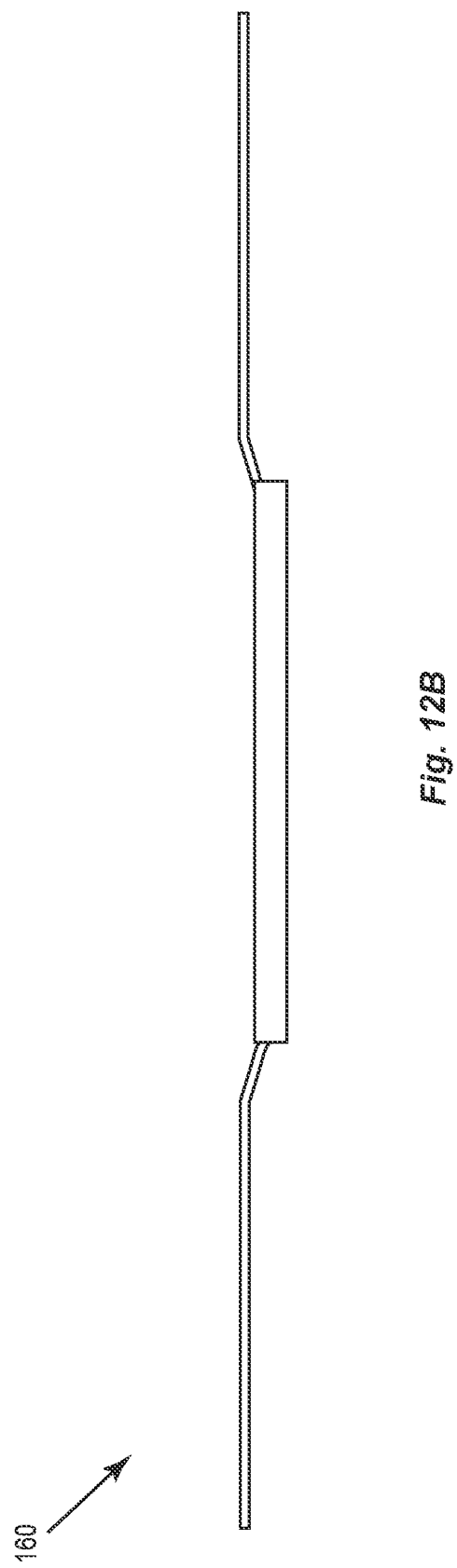

ial outline style package. This type of semiconductor package includes a number of through-hole type leads that are arranged in a row and extend from one side of the package encapsulant body. An important design consideration in discrete power device packages is creepage distance and clearance distance. Maintaining a high creepage distance and clearance distance between the load terminals of the package (e.g., source to drain, collector to emitter, anode to cathode, etc.) prevents unwanted electrical breakdown and/or arcing.

SEMICONDUCTOR PACKAGE WITH CONNECTION LUG

TECHNICAL FIELD

The instant application relates to semiconductor packaging, and more particularly to discrete power device packages.

BACKGROUND

High voltage semiconductor devices such as MOSFETs (metal oxide semiconductor field effect transistors), IGBTs (insulated gate bipolar transistors), etc., may be provided in a transistor outline style package. This type of semiconductor package includes a number of through-hole type leads that are arranged in a row and extend from one side of the package encapsulant body. An important design consideration in discrete power device packages is creepage distance and clearance distance. Maintaining a high creepage distance and clearance distance between the load terminals of the package (e.g., source to drain, collector to emitter, anode to cathode, etc.) prevents unwanted electrical breakdown and/or arcing.

Modern electronics applications may arrange multiple discrete power semiconductor together in a densely packed arrangement. For example, a power electronics circuit such as a power inverter that is designed to accommodate power loads on the order of 100 KW (kilowatts) or more may be realized by connecting multiple discrete power semiconductor packages, e.g., 10 packages, 50 packages, 100 packages, etc., in parallel with one another. Each of the discrete power device packages may be mounted close to one another on a carrier, such as a PCB (printed circuit board). These parallelized arrangements of multiple discrete semiconductor packages require a large amount of board space, particularly in view of industry defined creepage and clearance requirements that place constraints on the lead spacing and overall footprint of the discrete semiconductor packages. Moreover, these parallelized arrangements present design challenges with respect to the power connections of the board, as signals with a large potential difference (e.g., 500V or more) must be routed in a closely congested area.

SUMMARY

Those skilled in the art will recognize additional features and advantages upon reading the following detailed description, and upon viewing the accompanying drawings.

A semiconductor package is disclosed. In an embodiment, the semiconductor package comprises a first die pad, a first semiconductor die mounted on the first die pad, an encapsulant body of electrically insulating material that encapsulates first die pad and the first semiconductor die, a plurality of package leads that each protrude out of a first outer face of the encapsulant body, a connection lug that protrudes out of a second outer face of the encapsulant body, the second outer face being opposite from the first outer face, wherein the first semiconductor die comprises first and second voltage blocking terminals, wherein the connection lug is electrically connected to one of the first and second voltage blocking terminals of the first semiconductor die, and wherein a first one of the package leads is electrically connected to an opposite one of the first and second voltage blocking terminals of the first semiconductor die that the first connection lug is electrically connected to.

Separately or in combination, the connection lug comprises a planar tab that is exposed from the encapsulant body and a perforation in the planar tab.

Separately or in combination, the semiconductor package further comprises a second semiconductor die, wherein the second semiconductor die comprises first and second voltage blocking terminals, wherein the connection lug is electrically connected to one of the first and second voltage blocking terminals of the second semiconductor die, and wherein the first package lead is electrically connected to an opposite one of the first and second voltage blocking terminals of the second semiconductor die that the first connection lug is electrically connected to.

Separately or in combination, the semiconductor package further comprises a second die pad, wherein the second semiconductor die is mounted on the second die pad, wherein the first and second semiconductor dies are arranged between the first and second die pads such that the front surface of the first semiconductor die faces the front surface of the second semiconductor die.

Separately or in combination, the connection lug is continuously connected to a metal clip segment that is arranged between the first and second semiconductor dies, wherein the connection lug is electrically connected to the second voltage blocking terminals of the first and second semiconductor dies via the metal clip segment, and wherein the first package lead is electrically connected to the first voltage blocking terminals of the first and second semiconductor dies.

Separately or in combination, the first and second semiconductor dies each further comprise a gate terminal, wherein the plurality of package leads further comprise a second package lead and a third package lead, wherein the second package lead is electrically connected to the gate terminals of the first and second semiconductor dies, and wherein the third package lead is electrically connected to the second voltage blocking terminals of the first and second semiconductor dies.

Separately or in combination, the first and second semiconductor dies each further comprise a gate terminal, wherein the plurality of package leads further comprise a second package lead, a third package lead, a fourth package lead, and a fifth package lead, wherein the second package lead is electrically connected to the gate terminal of the first semiconductor die, wherein the third package lead is electrically connected to the second voltage blocking terminal of the first semiconductor die, wherein the fourth package lead is electrically connected to the gate terminal of the second semiconductor die, and wherein the fifth package lead is electrically connected to the second voltage blocking terminal of the second semiconductor die.

Separately or in combination, the first and second semiconductor dies each further comprise a gate terminal, wherein the plurality of package leads further comprise a second package lead, a third package lead, a fourth package lead, a fifth package lead, and a sixth package lead, wherein the connection lug is electrically connected to the first voltage blocking terminal of the first semiconductor die via the first die pad and is electrically connected to the first voltage blocking terminal of the second semiconductor die via the second die pad, wherein the first and second package leads are electrically connected to the second voltage blocking terminals of the first and second semiconductor dies, wherein the third package lead is electrically connected to the gate terminal of the first semiconductor die, wherein the fourth package lead is electrically connected to the second voltage blocking terminal of the first semiconductor die, wherein the fifth package lead is electrically connected to the gate terminal of the second semiconductor die, and wherein the sixth package lead is electrically connected to the second voltage blocking terminal of the second semiconductor die.

Separately or in combination, the second semiconductor die is mounted on the first die pad adjacent to the first semiconductor die, wherein the first connection lug is continuously connected to the first die pad, and wherein the connection lug is electrically connected to the first voltage blocking terminals of each of the first and second semiconductor dies via the first die pad.

Separately or in combination, the first semiconductor die is a discrete power device that is rated to block at least 100 V between the first and second voltage blocking terminals of the first semiconductor die.

According to another embodiment, the semiconductor package further comprises a first discrete transistor die, an encapsulant body of electrically insulating material that encapsulates the first discrete transistor die, a plurality of package leads that each protrude out of a first outer face of the encapsulant body, a connection lug that protrudes out of a second outer face of the encapsulant body, the second outer face being opposite from the first outer face, wherein the first discrete transistor die is an IGBT die or a MOSFET die, wherein in the case that the first discrete transistor die is an IGBT die, the connection lug is electrically connected to a emitter terminal of the first discrete transistor die and a first one of the package leads is electrically connected to a collector terminal of the first discrete transistor die, or wherein in the case that the first discrete transistor die is a MOSFET die, the connection lug is electrically connected to a source terminal of the first discrete transistor die and a first one of the package leads is electrically connected to a drain terminal of the first discrete transistor die.

Separately or in combination, the semiconductor package further comprises a first die pad, wherein the first discrete transistor die is mounted on the first die pad, and wherein an outer surface of the first die pad is exposed from a third outer face of the encapsulant body.

Separately or in combination, the semiconductor package further comprises a second discrete transistor die, wherein the second discrete transistor die is an IGBT die or a MOSFET die, wherein in the case that the second discrete transistor die is an IGBT die, the connection lug is electrically connected to a emitter terminal of the second discrete transistor die and the first package lead is electrically connected to a collector terminal of the second discrete transistor die, or wherein in the case that the first second transistor die is a MOSFET die, the connection lug is electrically connected to a source terminal of the second discrete transistor and the first package lead is electrically connected to a drain terminal of the second discrete transistor die.

Separately or in combination, the semiconductor package further comprises a second die pad, wherein the second discrete transistor die is mounted on the second die pad, and wherein an outer surface of the second die pad is exposed from a fourth outer face of the encapsulant body that is opposite from the third outer face of the encapsulant body.

Separately or in combination, the second discrete transistor die is mounted on the first die pad.

According to another embodiment, the semiconductor package comprises a first discrete transistor die, an encapsulant body of electrically insulating material that encapsulates the first discrete transistor die, a plurality of package leads that each protrude out of a first outer face of the encapsulant body, a connection lug that protrudes out of a second outer face of the encapsulant body, the second outer face being opposite from the first outer face, wherein the first discrete transistor die is an IGBT die or a MOSFET die, wherein in the case that the first discrete transistor die is an IGBT die, the connection lug is electrically connected to a collector terminal of the first discrete transistor die and a first one of the package leads is electrically connected to an emitter terminal of the first discrete transistor die, or wherein in the case that the first discrete transistor die is a MOSFET die, the connection lug is electrically connected to a drain terminal of the first discrete transistor die and a first one of the package leads is electrically connected to a source terminal of the first discrete transistor die.

Separately or in combination, the semiconductor package further comprises a first die pad, wherein the first discrete transistor die is mounted on the first die pad, and wherein an outer surface of the first die pad is exposed from a third outer face of the encapsulant body.

Separately or in combination, the semiconductor package further comprises a second discrete transistor die, wherein the second discrete transistor die is an IGBT die or a MOSFET die, wherein in the case that the second discrete transistor die is an IGBT die, the connection lug is electrically connected to a collector terminal of the second discrete transistor die and the first package lead is electrically connected to an emitter terminal of the second discrete transistor die, or wherein in the case that the first second transistor die is a MOSFET die, the connection lug is electrically connected to a drain terminal of the second discrete transistor and the first package lead is electrically connected to a source terminal of the second discrete transistor die.

Separately or in combination, the semiconductor package further comprises a second die pad, wherein the second discrete transistor die is mounted on the second die pad, and wherein an outer surface of the second die pad is exposed from a fourth outer face of the encapsulant body that is opposite from the third outer face of the encapsulant body.

Separately or in combination, the second discrete transistor die is mounted on the first die pad.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIG. 2A illustrates a schematic circuit of the switching device as an IGBT; and FIG. 2B illustrates schematic circuit of the switching device as a MOSFET.

FIG. 4, which includes FIG. 4A depicts a schematic equivalent circuit of the semiconductor package, according to an embodiment, FIGS. 4B-4C illustrate the exterior of the semiconductor package, according to an embodiment, and FIGS. 4D-4E illustrate the exterior of the semiconductor package, according to another embodiment.

FIG. 5, which includes FIGS. 5A-5J, illustrates selected method steps for forming a semiconductor package, according to an embodiment.

FIG. 6, which includes FIG. 6A depicts a schematic equivalent circuit of the semiconductor package, according to an embodiment, FIGS. 6B-6C illustrate the exterior of the semiconductor package, according to an embodiment, and FIGS. 6D-6E illustrate the exterior of the semiconductor package, according to another embodiment.

FIG. 7, which includes

FIG. 8, which includes FIG. 8A depicts a schematic equivalent circuit of the semiconductor package, according to an embodiment, and FIGS. 8B-8C illustrate the exterior of the semiconductor package, according to an embodiment.

FIG. 10, which includes FIGS. 10A-10F, illustrates selected method steps for forming a semiconductor package, according to an embodiment.

FIG. 11, which includes FIG. 11A depicts a schematic equivalent circuit of the semiconductor package, according to an embodiment, and FIGS. 11B-11C illustrate the exterior of the semiconductor package, according to an embodiment.

FIG. 12, which includes FIGS. 12A-12D, illustrates selected method steps for forming a semiconductor package, according to an embodiment.

FIG. 13, which includes FIG. 13A depicts a schematic equivalent circuit of the semiconductor package, according to an embodiment, and FIGS. 13B-13C illustrate the exterior of the semiconductor package, according to an embodiment.

FIG. 14, which includes

DETAILED DESCRIPTION

Figure 1:
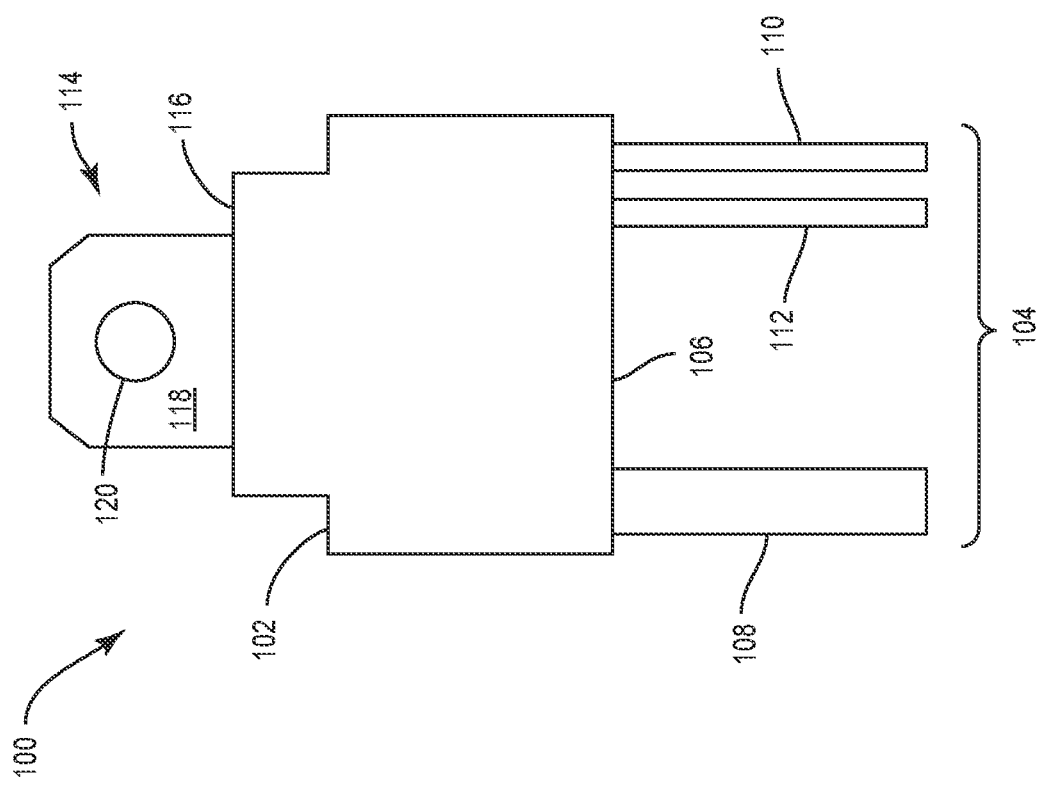
FIG. 1 illustrates a semiconductor package that is configured as a discrete power device, according to an embodiment.

Embodiments of a semiconductor package and corresponding methods of producing the semiconductor package are described herein. The semiconductor package may be configured as a discrete power device that is rated to block a large voltage e.g., 100V (volts), 600V, 1,200V or more and/or conduct a large current, e.g., 1 A (amperes), 100 A, 500 A or more, as between two load terminals. The semiconductor package is configured such that the load terminals are provided on opposite sides of the encapsulant body. A first one of the load terminals is provided by a through-hole type package lead, which is part of a group of package leads that extend away from a first outer face of the encapsulant body. A second one of the load terminals is provided by a connection lug that extends away from a second outer face of the encapsulant body that is opposite from the first outer face. Thus, the connection lug is provided on an opposite side of the encapsulant body as the group of package leads. By spacing apart the first and second load terminals of the semiconductor package in this way, a large creepage and clearance distance relative to overall package size can be obtained. Moreover, this arrangement can alleviate the power and reference potential distribution to the semiconductor package into separate vertical planes. For example, the semiconductor package can be mounted on a carrier such as a PCB, DBC (direct bonded copper) substrate, AMB (active metal braze) substrate, etc., with a busbar affixed to the connection lug. This arrangement allows for the fixed voltages which have a large potential difference (e.g., a voltage difference of 500V or more) to be distributed in different vertical planes, with the carrier supplying one of the fixed voltage via the package leads and a busbar that is vertically spaced apart from the carrier providing the other one of the fixed voltages.

The semiconductor package described herein can have a variety of different electrical connectivity configurations, die configurations, and lead frame configurations. Examples of these configurations include configurations wherein the connection lug is the source/emitter terminal (in the case of an IGBT or MOSFEET), configurations wherein the connection lug is the drain/collector terminal (in the case of an IGBT or MOSFEET), configurations wherein the semiconductor package includes multiple discrete transistor dies and the control terminals of different transistor dies are connected to common leads, configurations wherein the semiconductor package includes multiple discrete transistor dies and the control terminals of different transistor dies are connected to separate leads, and configurations that include a single discrete transistor die. Advantageous methods are disclosed herein to produce the semiconductor package configurations. Examples of these methods include methods that utilize two different lead frames to produce a single packaged device, methods that utilize two identical or substantially identical lead frames to produce a single packaged device, methods that utilize only a single lead frame to produce a single packaged device, methods that utilize a clip frame that is separate from the lead frame or frames to provide the connection lug of the packaged device, and methods that provide the connection lug as part of the same lead frame that accommodates the semiconductor dies to produce the packaged device.

Referring to FIG. 1, a semiconductor package 100 is depicted, according to an embodiment. The semiconductor package 100 comprises an encapsulant body 102 that is formed from an electrically insulating material, e.g., mold compound, thermosetting plastic, laminate materials, etc. The semiconductor package 100 comprises a plurality of package leads 104 that protrude out from a first outer face 106 of the encapsulant body 102. The package leads 104 are electrically conductive structures that are configured to be inserted into a circuit carrier, such as a PCB. As shown, the semiconductor package 100 comprises three of the package leads 104, namely, a first package lead 108, a second package lead 110, and a third package lead 112. More generally, the semiconductor package 100 may comprise different numbers of the package leads 104 protruding out from the first outer face 106 of the encapsulant body 102, e.g., two of the package leads 104, four of the package leads 104, five of the package leads 104, six of the package leads 104, etc.

Figure 3:
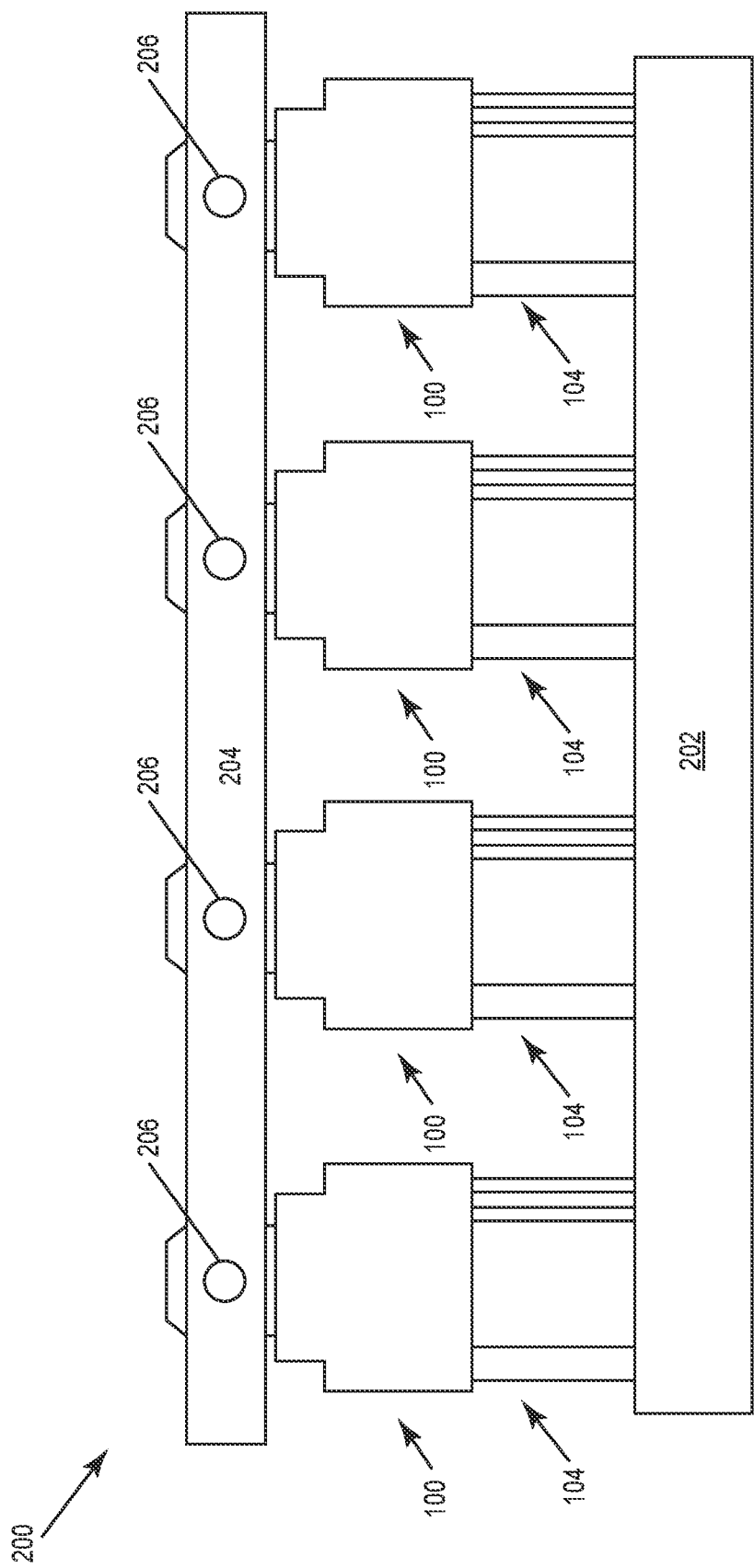
FIG. 3 illustrates an assembly with multiple semiconductor packages arranged on a circuit board and a busbar that is connected to a connection lug of each semiconductor package, according to an embodiment.

The semiconductor package 100 comprises a connection lug 114 that protrudes out from a second outer face 116 of the encapsulant body 102 that is opposite from the first outer face 106 of the encapsulant body 102. The connection lug 114 comprises a planar tab 118 and a perforation 120 in the planar tab 118. The connection lug 114 is an electrically conductive structure that is configured to be mated with a metal bar or strip and secured via a fastener such as a screw or pin inserted through the perforation 120, e.g., as shown in FIG. 3.

Generally speaking, the package leads 104 and the connection lug 114 may comprise any electrically conductive material such as copper (Cu) nickel (Ni), silver (Ag), palladium (Pd), gold (Au), etc., alloys or combinations thereof.

According to an embodiment, the semiconductor package 100 is configured as a discrete power device. A discrete power device refers to a single packaged device that is configured to block high voltages and and/or to conduct high currents as between two load terminals. Generally speaking, a discrete power device may be rated to block voltages of at least 100V, and more commonly on the order of 250V, 500V, 600V, 1,200V, 2,000V and/or may be rated to conduct currents of 10 A, 50 A, 100 A, 500 A or more. A discrete power device may comprise one or more semiconductor dies connected between the two load terminals of the semiconductor package. These semiconductor dies may each be configured as a discrete diode die, a discrete MOSFET (Metal Oxide Semiconductor Field Effect Transistor) die, a discrete IGBT (Insulated Gate Bipolar Transistor) die, a discrete HEMT (High Electron Mobility Transistors) die, a discrete JFET (Junction Field Effect Transistors) die, etc. These semiconductor dies may each be rated to block voltages of at least 100V, and more commonly on the order of 250V, 500V, 600V, 1,200V, 2,000V and/or may be rated to conduct currents of 10 A, 50 A, 100 A, 500 A or more.

The semiconductor package 100 is configured such that the connection lug 114 provides one of the load terminals and such that one or more of the package leads 104 provides the opposite one of the load terminals. The load terminals refer to the terminal of the package 100 that block and/or control the rated voltage and current. In the above listed device types, the connection lug 114 can correspond to the source terminal in the case of a MOSFET or HEMT, the emitter terminal in the case of an IGBT, and so forth, with one or more of the package leads 104 corresponding to the opposite terminal of the device, i.e., the drain terminal in the case of a MOSFET or HEMT, the collector terminal in the case of an IGBT, and so forth. The opposite polarity is possible as well. Thus, the connection lug 114 can correspond to the drain terminal in the case of a MOSFET or HEMT, the collector terminal in the case of an IGBT, and so forth, with one or more of the package leads 104 corresponding to the opposite terminal of the device, i.e., the source terminal in the case of a MOSFET or HEMT, the emitter terminal in the case of an IGBT, and so forth. In either case, an advantageous configuration with respect to creepage and clearance between the load terminals of the device is realized. Creepage refers to the shortest path between two conductors along an insulating surface. In this case, the creepage distance is measured along the encapsulant body 102 of the semiconductor package 100. Clearance refers to the shortest path between two conductors measured through air, e.g., a direct path through air between two leads. In comparison to a package design wherein both load terminals are provided by through-hole type leads extending out from one side of the package, the semiconductor package 100 disclosed herein advantageously improves both creepage and clearance. Moreover, by configuring the connection lug 114 as one of the load terminals, this frees up one of the package leads 104 to be used for other purposes, e.g., sensing terminals, independent gate terminals in the case of two discrete dies, etc.

Figure 2B:
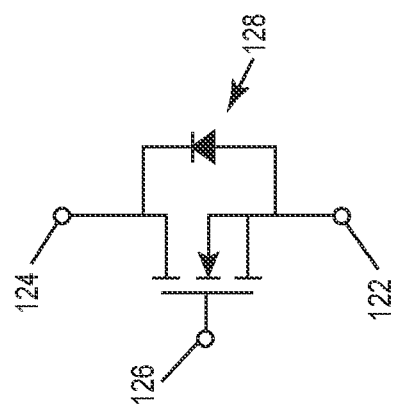
FIGS. 2A, and 2B illustrates a schematic circuit of a discrete switching device that may be incorporated into a semiconductor package, according to an embodiment.
Figure 2A:
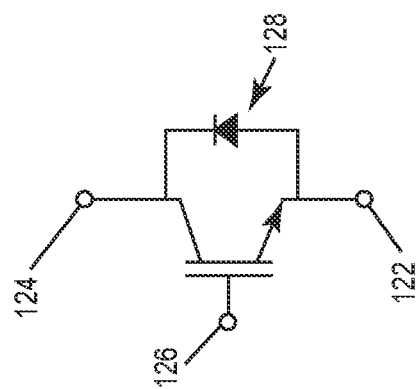

Referring to FIG. 2, two potential equivalent circuit schematics for the semiconductor package 100 are depicted, according to an embodiment. In the example of FIG. 2A, the semiconductor package 100 is configured as a discrete IGBT device. In the example of FIG. 2B, the semiconductor package 100 is configured as a discrete MOSFET device. While the depicted examples show n-type enhancement devices, more generally the semiconductor package 100 may utilize either n-channel or p-channel devices and enhancement or depletion mode devices. In each case, the semiconductor package 100 comprises first and second load terminals 122, 124. In the IGBT configuration of FIG. 1B, the first and second load terminals 122, 124 correspond to the emitter and collector terminals, respectively. In the MOSFET configuration of FIG. 1C, the first and second load terminals 122, 124 correspond to the source and drain terminals, respectively. The semiconductor package 100 further comprises a first control terminal 126, which corresponds to the gate (also referred to as base) terminal of the IGBT of FIG. 1B, and corresponds to the gate terminal in the case of the MOSFET of FIG. 1C. In a commonly known manner, the circuit is configured to control a current flowing between the first and second load terminals 122, 124 and to block a voltage between the between the first and second load terminals 122, 124, through appropriate biasing of the control terminal, i.e., gate-emitter bias or gate-source bias. The switching circuits additionally comprise a diode 128 connected between the first and second load terminals 122, 124. This diode may be provided as a so-called freewheeling or reverse conducting diode that permits current to flow in an opposite direction as the forward conduction current of the IGBT or MOSFET.

According to one embodiment, the connection lug 114 is configured as the first load terminal 122 and the first package lead 108 is configured as the second load terminal 124. In the IGBT configuration of FIG. 2A, this means that the connection lug 114 corresponds to the emitter terminal and the first package lead 108 corresponds to the collector terminal. In the MOSFET configuration of FIG. 2B, this means that the connection lug 114 corresponds to the source terminal and the first package lead 108 corresponds to the drain terminal. According to another embodiment, the connection lug 114 is configured as the second load terminal 124 and the first package lead 108 is configured as the first load terminal 122. In the IGBT configuration of FIG. 2A, this means that the connection lug 114 corresponds to the collector terminal and the first package lead 108 corresponds to the emitter terminal. In the MOSFET configuration of FIG. 2B, this means that the connection lug 114 corresponds to the drain terminal and the first package lead 108 corresponds to the source terminal.

Referring to FIG. 3, an assembly 200 that comprises multiples ones of the semiconductor packages 100 described with reference to FIG. 1 is depicted, according to an embodiment. The assembly 200 comprises a circuit carrier 202, which may be a PCB, DCB substrate, AMB substrate, etc. Each of the semiconductor packages 100 are mounted on the circuit carrier 102 with the package leads 104 being inserted into correspondingly dimensioned receptacles in the circuit carrier 200. The circuit carrier 200 comprises conductive traces (not shown) that provide electrical signaling to each of the semiconductor packages 100 via the package leads 104. For example, circuit carrier 200 may be configured to provide a fixed voltage to the semiconductor packages 100 (e.g., GND or a supply voltage such as 500V, 1,000V, 1,200V, etc.) as well as control signaling to control a switching operation of the semiconductor packages 100. Additionally, the circuit carrier 200 may be configured to receive a sense signal from one of the package leads 104 of each of the semiconductor packages 100.

The assembly 200 comprises a busbar 204 that is connected to the connection lugs 114 of each semiconductor package 100. The busbar 204 is an electrically conductive structure, e.g., a metal structure comprising aluminum, copper, etc., that mechanically and electrically contacts the connection lugs 114 of each semiconductor package 100. As shown, a fastener 206 is inserted through the perforations 120 of each connection lug 114. More generally, any kind of electrical contact technique or structure, e.g., pins, clamps, soldering, etc. may be utilized to effectuate an electrical connection. The busbar 204 may be configured to provide a second fixed voltage (e.g., GND or a supply voltage such as 500V, 1,000V, 1,200V, etc.) to the semiconductor packages 100 that is opposite from the fixed voltage supplied by the circuit carrier 200.

Referring to FIG. 4, a semiconductor package 100 that comprises multiple discrete transistor dies is depicted, according to an embodiment. Referring to FIG. 4A, the equivalent circuit of the semiconductor package 100 comprises a first load terminal 122, a second load terminal 124, a first control terminal 126, and a first sense terminal 130. The semiconductor package 100 comprises first and second discrete transistor dies 132, 134, and first and second discrete diode dies 136, 138. Each of the first and second discrete transistor dies 132, 134 comprises a first voltage blocking terminal 140, a second voltage blocking terminal 142, and a gate terminal 144. Each of the first and second discrete diode dies 136, 138 comprises an anode terminal 146 and a cathode terminal 148. The first voltage blocking terminals 140 of the first and second discrete transistor dies 132, 134 and the anode terminals 146 of the first and second discrete diode dies 136, 138 are each connected to the first load terminal 122. The second voltage blocking terminals 142 of the first and second discrete transistor dies 132, 134 and the cathode terminals 148 of the first and second discrete diode dies 136, 138 are each connected to the second load terminal 124. The gate terminals 144 of each of the first and second discrete transistor dies 132, 134 are connected to the first control terminal 126. The second voltage blocking terminals 142 of the first and second discrete transistor dies 132, 134 are additionally and separately electrically connected to the first sense terminal 130.

In the depicted embodiment, the first and second discrete transistor dies 132, 134 are configured as discrete IGBT dies, wherein the first voltage blocking terminal 140 corresponds to the emitter terminal and the second voltage blocking terminal 142 corresponds to the collector terminal. In another embodiment, the first and second discrete transistor dies 132, 134 may be configured as discrete MOSFET dies, and the first voltage blocking terminal 140 may correspond to the source terminal and the second voltage blocking terminal 142 may correspond to the drain terminal. In the case of a MOSFET, the first and second discrete diode dies 136, 138 may be optionally be omitted, and the equivalent functionality may be replicated by an intrinsic body diode of the MOSFET device. In this configuration, the semiconductor package 100 is configured as a discrete switching device that utilizes two discrete transistor dies to provide the equivalent functionality of the respective circuits described with reference to FIGS. 1A and 1B, wherein the load voltage is distributed across both of the transistor dies (roughly equally in the case of identical devices), and the switching operation of both dies is controlled in unison by the first control terminal 126. To this end, the first and second discrete transistor dies 132, 134 may have substantially similar or identical parameters so that the operational voltages/currents are distributed roughly equally across the semiconductor dies. The first sense terminal 130 allows for the measurement of the load voltage across the switching devices. This allows the operational state of the switching devices to be monitored for potentially damaging conditions, e.g., avalanche breakdown, short circuit, overheat, etc.

Figure 4A:
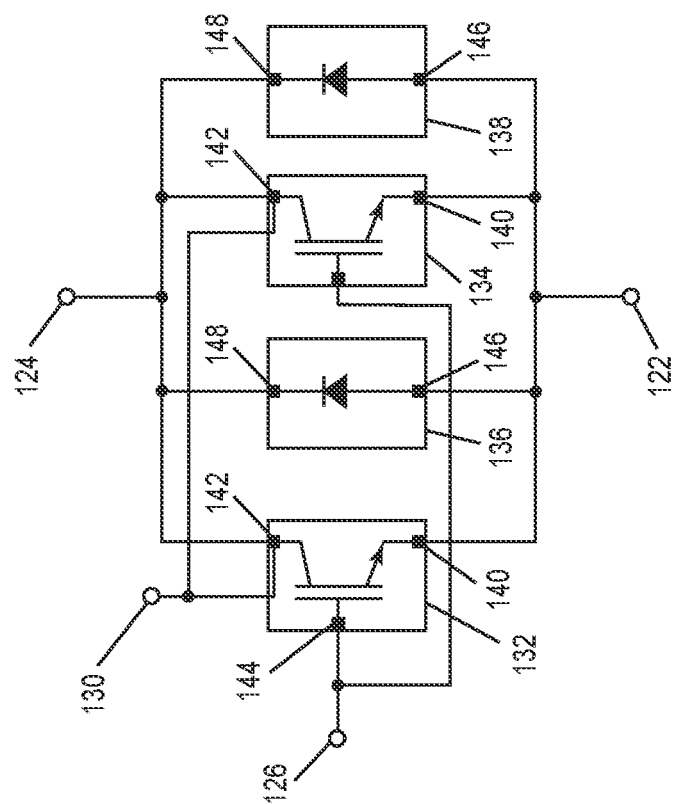
FIGS. 4A-4E, illustrates a semiconductor package that is configured as a discrete switching device, according to an embodiment.
Figure 4C:
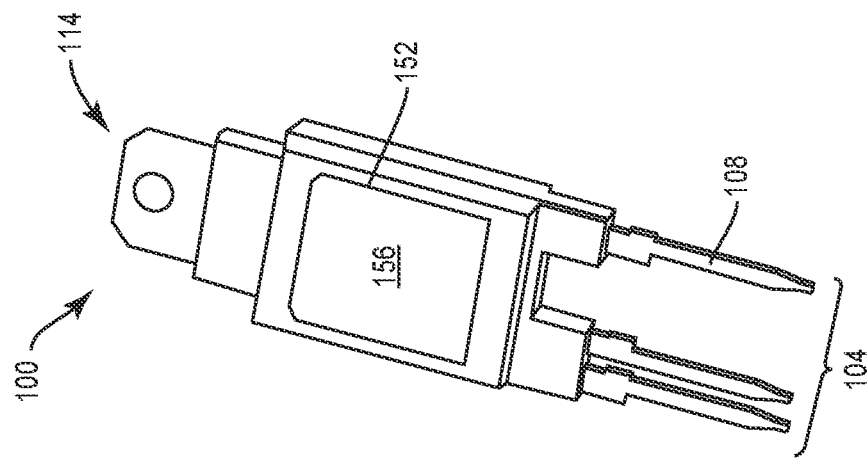
Figure 4B:
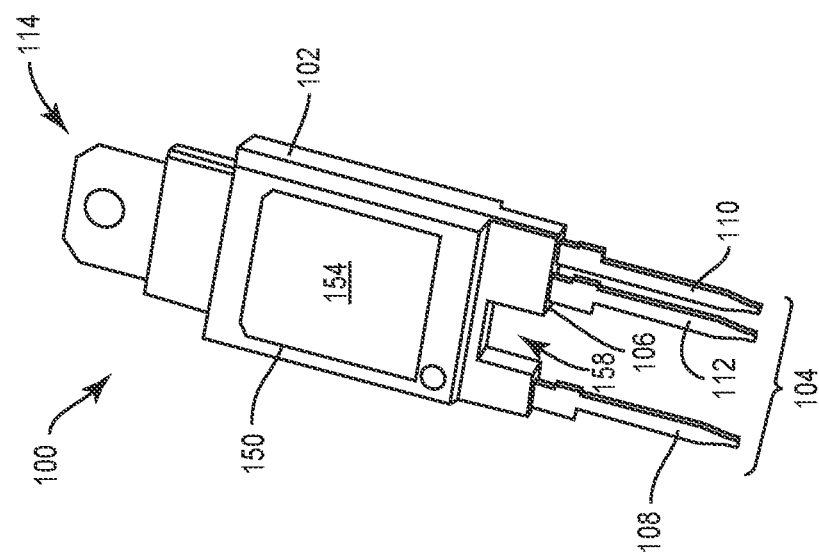

Referring to FIGS. 4B-4C, a semiconductor package 100 comprises three package leads 104 protruding out from the first outer face 106 of the encapsulant body 102, namely, a first package lead 108, a second package lead 110 and a third package lead 112, and comprises a connection lug 114 protruding out from the second outer face 116 of the encapsulant body 102. The semiconductor package 100 may have the following correspondence to the circuit described with reference to FIG. 3A. The connection lug 114 may correspond to the first load terminal 122, the first package lead 108 may correspond to the second load terminal 124, the second package lead 110 may correspond to the first control terminal 126, and the third package lead 112 may correspond to the first sense terminal 130.

The semiconductor package 100 comprises first and second die pads 150, 152. As shown in FIG. 4B, an outer surface 154 of the first die pad 150 is exposed from a third outer face of the encapsulant body 102. As shown in FIG. 4C, an outer surface 156 of the second die pad 152 is exposed from a fourth outer face of the encapsulant body 102, which is opposite from the third outer face of the encapsulant body 102. This arrangement provides a two-sided cooling configuration wherein thermally conductive surfaces are provided on opposite sides of the package. Both of these thermally conductive surfaces may be used to extract heat away from the semiconductor package 100, e.g., using a separate heat sink structure or structures. Both of the first and second die pads 150, 152 may accommodate the mounting of one or more semiconductor dies thereon. For example, the first discrete transistor die 132 and the first discrete diode die 136 may be mounted on the first die pad 150, and the second discrete transistor die 140 and the second discrete diode die 138 may be mounted on the second die pad 152.

The semiconductor package 100 comprises a notch 158 in the encapsulant body 102 between the first package lead 108 and the other ones of the package leads 104. The notch 158 may be preferable for increased creepage distance, particularly between the first and second package leads 108, 110.

Figure 4E:
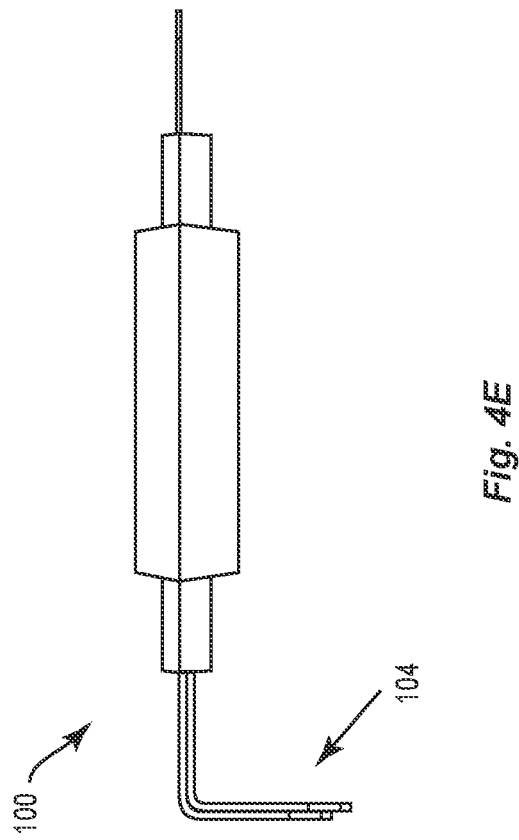
Figure 4D:
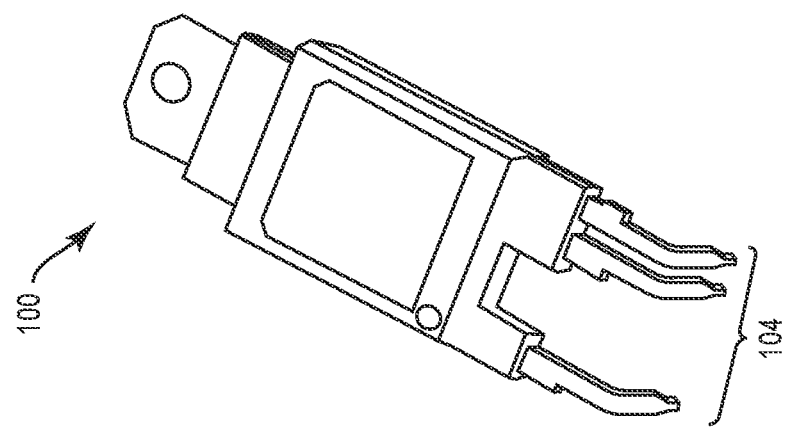

Referring to FIGS. 4D-4E, the semiconductor package 100 is substantially the same as the embodiment described with reference to FIGS. 4D-4E, except that the package leads 104 are bent in this embodiment. This package arrangement allows for flexibility in the mounting of the semiconductor package 100 on a circuit carrier (e.g., a PCB) while utilizing the cooling capability of the exposed die pads.

Referring to FIG. 5, selected processing steps for producing the semiconductor package 100 described with reference to FIG. 4 are depicted, according to an embodiment.

Figure 5A:
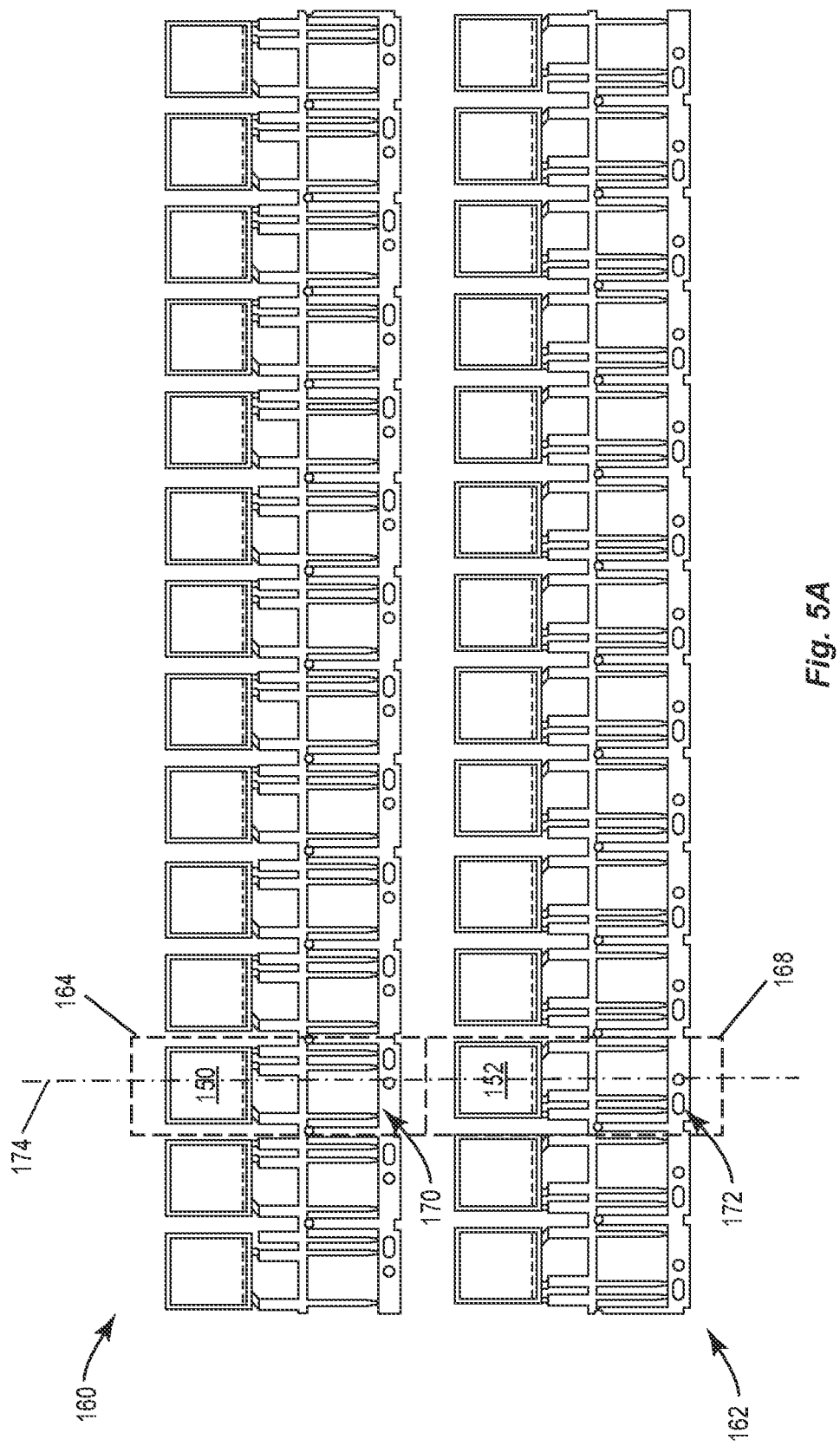

Referring to FIG. 5A, a first lead frame strip 160 and a second lead frame strip 162 are provided. The first lead frame strip 160 comprises a plurality of first unit lead frames 164 which have an identical configuration to one another. The second lead frame strip 162 comprises a plurality of second unit lead frames 168 which have an identical configuration to one another. The first and second lead frame strips 160, 162 are formed from an electrically conductive material such as copper (Cu), aluminium (Al), nickel (Ni), nickel phosphorous (NiP), silver (Ag), palladium (Pd) gold (Au), etc., alloys or combinations thereof. According to one technique, the first and second lead frame strips 160, 162 are provided by a sheet of metal, e.g., a substantially uniform thickness sheet of any one or combination of the above-listed metals, and the various features of the lead frame are formed by performing techniques such as stamping, punching, etching, bending, etc.

Figure 6A:
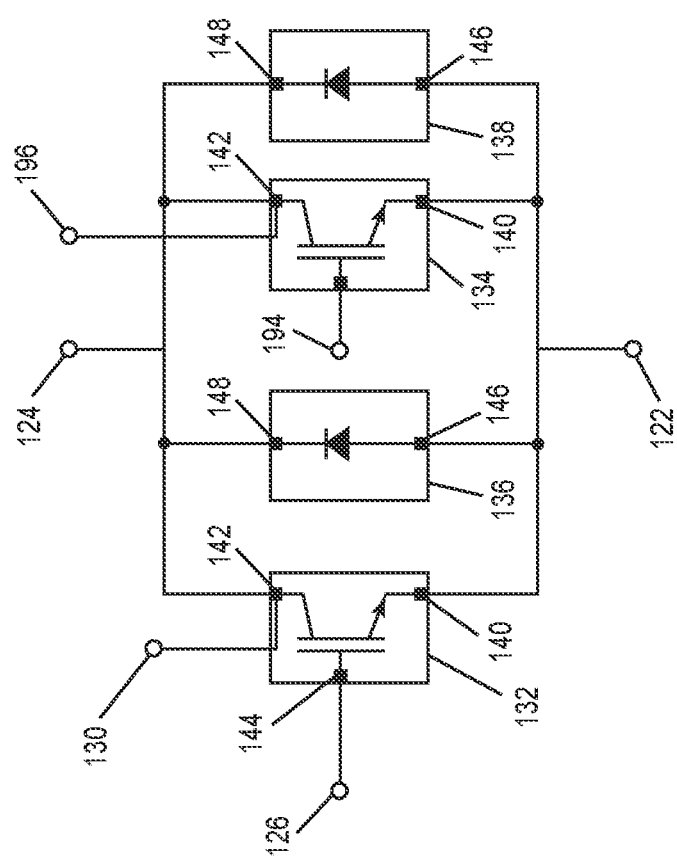
FIGS. 6A-6E, illustrates a semiconductor package that is configured as a discrete switching device, according to an embodiment.
Figure 6B:
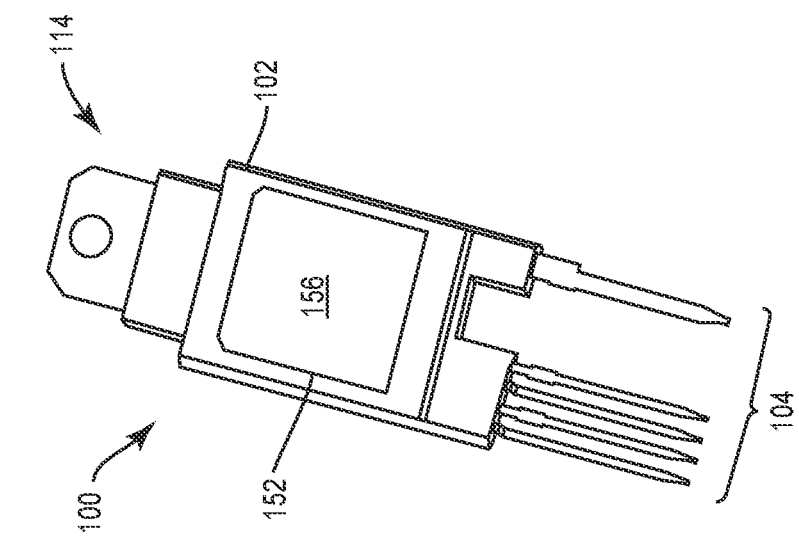
Figure 6C:
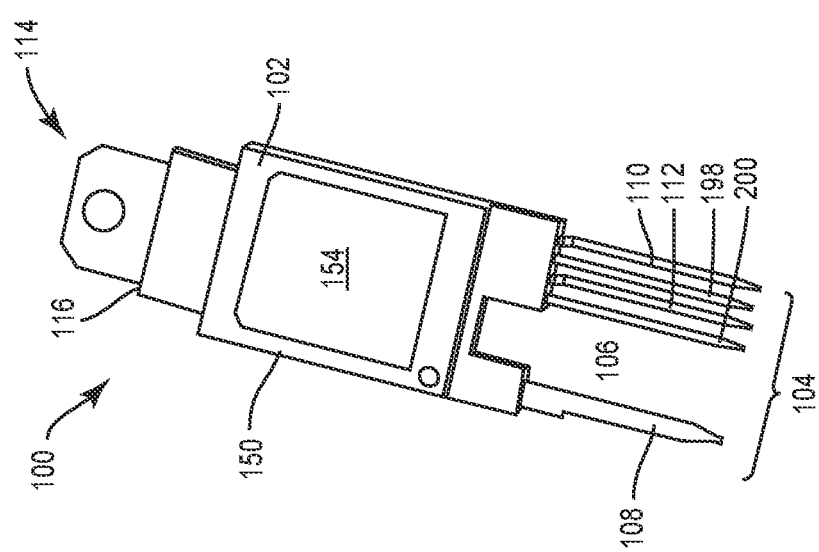

The first unit lead frames 164 comprise a first die pad 150 and a first row 170 of leads that each extend away from the first die pad 150. The second unit lead frames 168 comprises a second die pad 152 and a second row of leads 172 that each extend away from the second die pad 152. One or both of the first and second unit lead frames 168 may have a downset configuration, meaning that the first and second die pads 150, 152 are disposed on different vertical planes as outer portions of the leads, e.g., as shown in FIGS. 6B and 6C.

The first lead frame strip 160 differs from the second lead frame strip 162 in the following way. From a plan-view perspective, the first and second unit lead frames 170, 168 have a mirrored geometry with respect to a central plane 174 that extends parallel to the leads. Thus, the lead configuration of the second unit lead frame 168 is reversed in comparison to the lead configuration of the first unit lead frame 164.

Figure 5B:
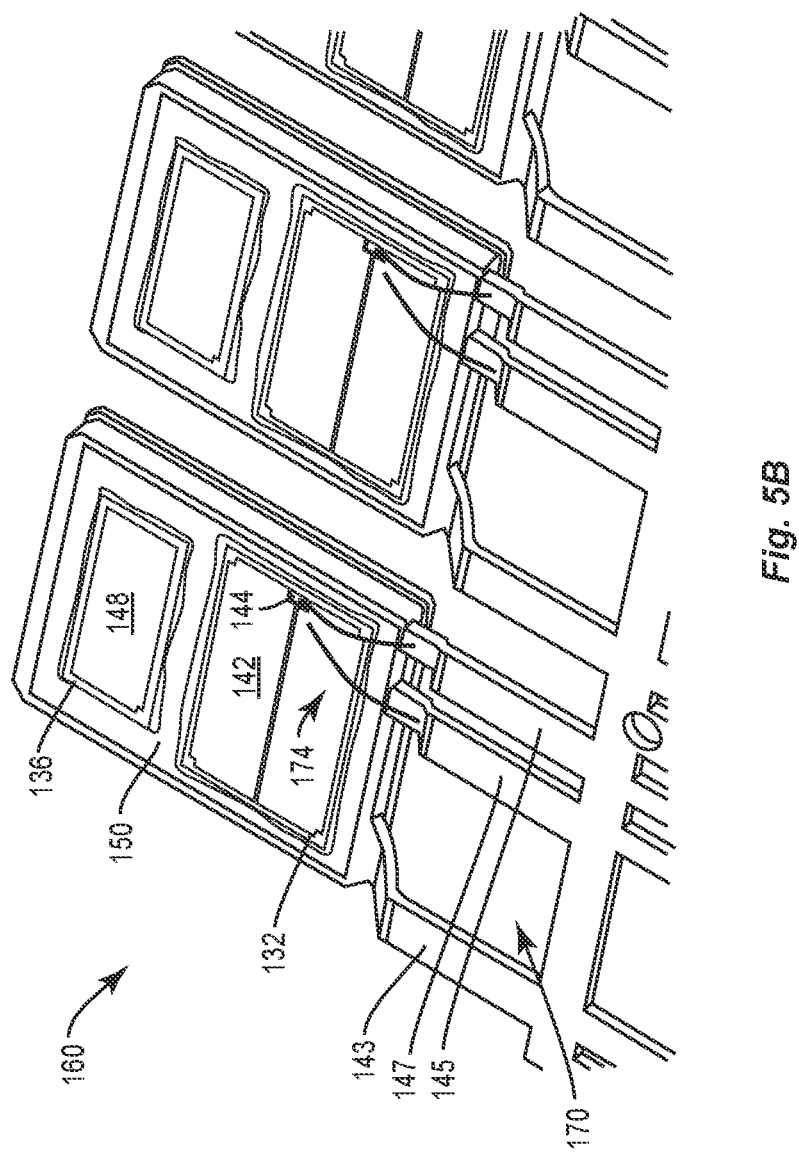

Referring to FIG. 5B, a first discrete transistor die 132 and a first discrete diode 136 are mounted on the first die pads 150 of the first lead frame strip 160. A conductive adhesive, e.g., solder, sinter, conductive glue, etc. may be provided between the rear surfaces of the first discrete transistor die 132 and the first discrete diode 136 to effectuate this mounting. The first discrete transistor die 132 and the first discrete diode 136 are each configured as vertical devices such that the first voltage blocking terminal 140 of the first discrete transistor die 132 and the anode terminal 146 of the first discrete diode 136 (not seen in FIG. 5B) face and electrically connect with the first die pad 150. A first one 143 of the leads from the first row of leads 170 is electrically connected to the first voltage blocking terminal 140 of the first discrete transistor die 132 and the anode terminal 146 of the first discrete diode 136 via the first die pad 150. Meanwhile, the second voltage blocking terminal 142 and the gate terminal 144 of the first discrete transistor die 132 is disposed on a front surface of the first discrete transistor die 132 that faces away from the first die pad 150. Likewise, the cathode 148 of the first discrete diode 136 is on a front surface of the first discrete diode 136 that faces away from the first die pad 150.

After mounting the first discrete transistor die 132 and the first discrete diode die 136, a wire bonding process is performed. Specifically, bond wires 174 are connected between the gate terminal 144 of the first discrete transistor die 132 and a second lead 145 from the first row 170 of leads, and between the second voltage blocking terminal 140 of the first discrete transistor die 132 and a third lead 147 from the first row 170 of leads. Instead of bond wires 174, these connections may be effectuated by any type of electrical interconnect element, e.g., ribbon, clip, etc. Moreover, the number of interconnect elements between each terminal and lead may vary from what is shown.

Figure 5C:
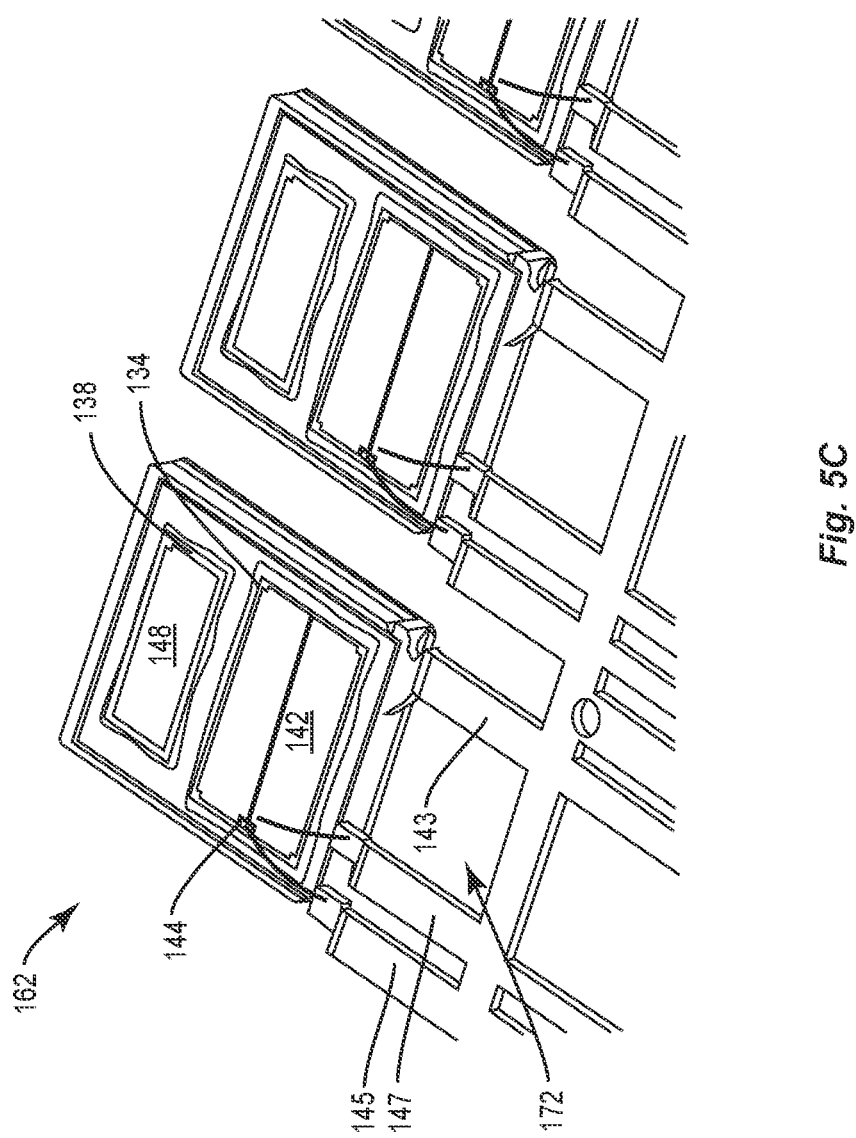

Referring to FIG. 5C, a second discrete transistor die 134 and a second discrete diode 138 are mounted on the first die pads 152 of the second lead frame strip 162, e.g., in a similar manner as previously described with reference to FIG. 5B. After mounting the second discrete transistor die 134 and the second discrete diode 138, a wire bonding process is performed, e.g., in a similar manner as previously described with reference to FIG. 5B to make corresponding connections with the second row 172 of leads.

Referring to FIG. 5D, a solder application step is performed. According to this step, regions of solder material 178 are applied to the upward facing device terminals on the semiconductor dies from both of the first lead frame strip 160 and the second lead frame strip 162. The regions of solder material 178 may also be applied on one or both of the first row 170 of leads and the second row 172 of leads. The regions of solder material 178 can be applied using pre-formed solder plates or by other techniques, such as jet, stencil, etc. The regions of solder material 178 may be configured as relatively thin (e.g., less than 30 μm and more typically less than 10 μm) regions that are subsequently soldered using a diffusion soldering technique.

Figure 5E:
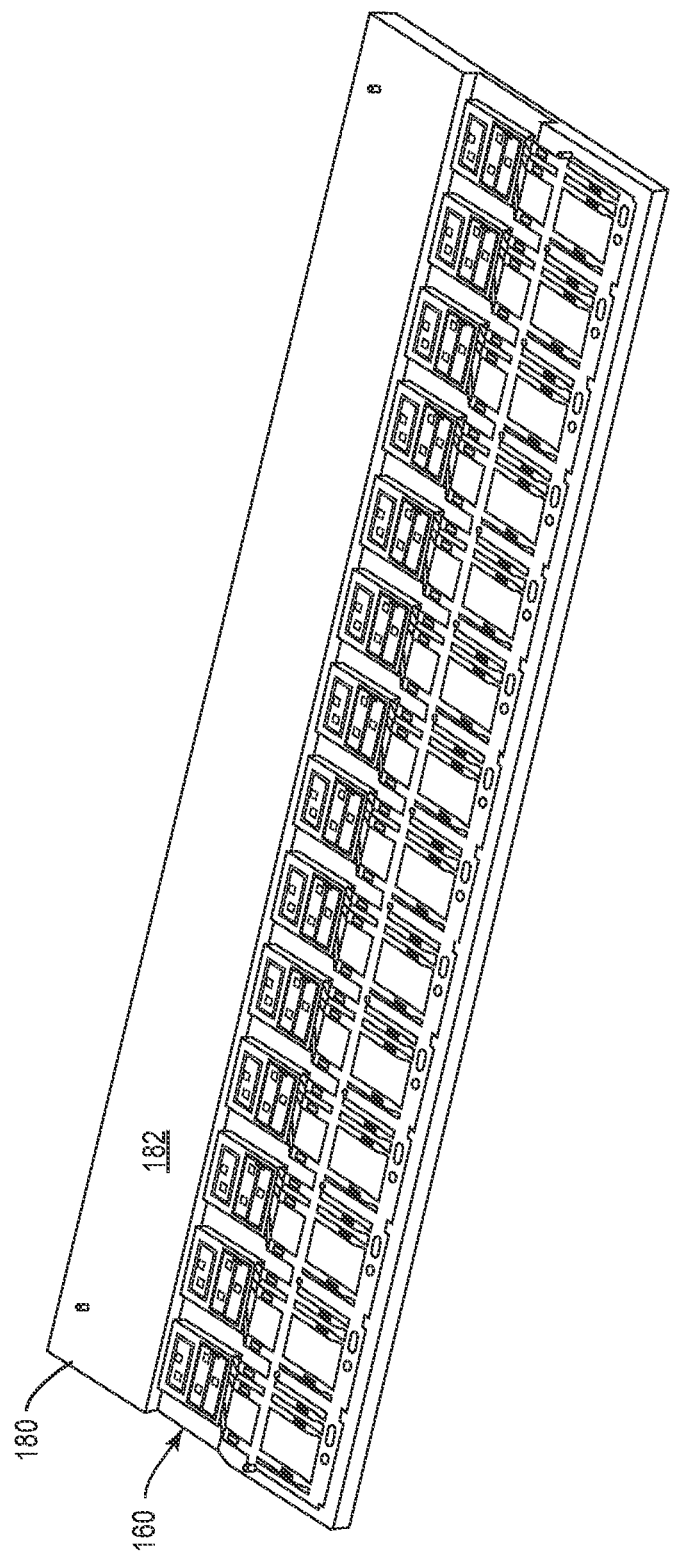

Referring to FIG. 5E, the first lead frame strip 160 with the semiconductor dies mounted thereon is placed on a first soldering tool 180. As can be seen, the first soldering tool 180 may be dimensioned to accommodate the first lead frame strip 160 such that the first lead frame strip 160 rests on a lower section of the first soldering tool 180 and such that the first lead frame strip 160 is disposed beneath a shelf 182 of the first soldering tool 180. Optionally, fasteners (e.g., screws) may be used to securely retain the first lead frame strip 160 against the first soldering tool 180.

Figure 5F:
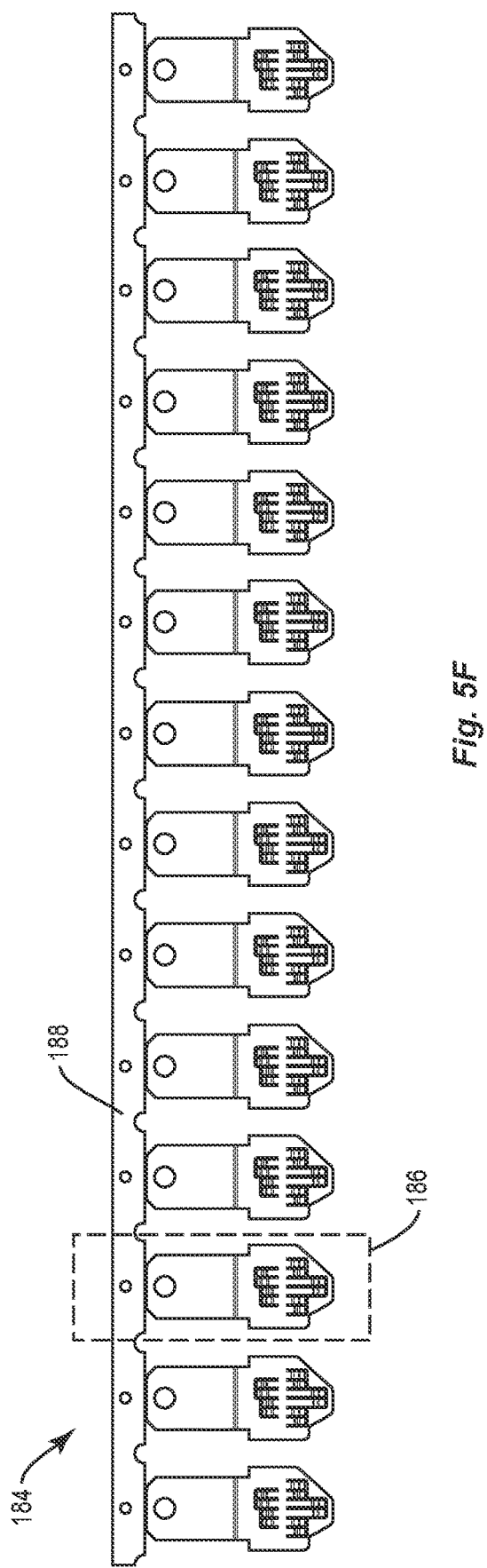

Referring to FIG. 5F, a clip frame strip 184 is provided. The clip frame strip 184 comprises a plurality of unit clips 186, each of which have an identical configuration to one another. The unit clips 186 are each attached to a peripheral bar 188 of the clip frame strip 184. The clip frame strip 184 is formed from an electrically conductive material such as copper (Cu) nickel (Ni), nickel phosphorous (NiP), silver (Ag), palladium (Pd) gold (Au), etc., alloys or combinations thereof. According to one technique, the clip frame strip 184 is provided by a sheet of metal, e.g., a substantially uniform thickness portion of any one or combination of the above-listed metals, and the various features of the unit clips 186 are formed by performing techniques such as stamping, punching, etching, bending, etc.

Figure 5G:
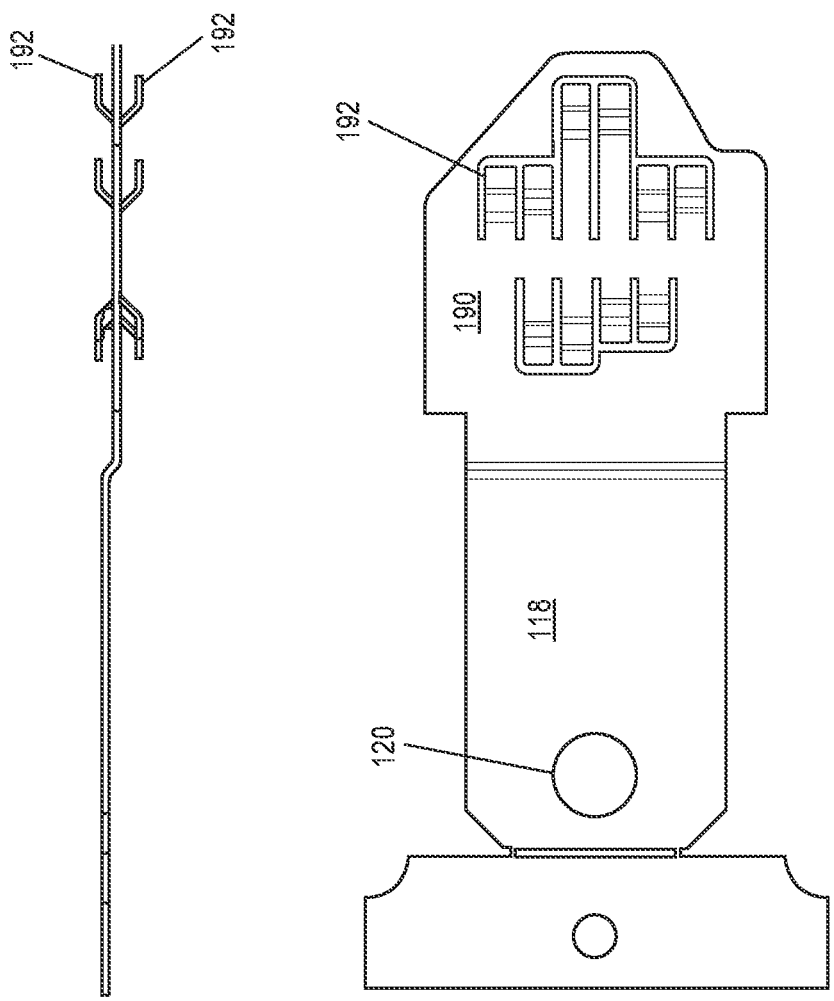

Referring to FIG. 5G, one of the unit clips 186 from the clip frame strip 184 is shown. Each of the unit clips 186 comprises a planar tab 118 and a metal clip segment 190. The planar tab 118 comprises a perforation 120 and corresponds to the exposed portion of the connection lug 114 as previously described. The metal clip segment 190 is continuously connected to the planar tab 118 and comprises projections 192 that extend away from the plane of the metal clip segment 190 in opposite directions. The projections 192 form electrical contact points at locations that are superjacent to and subjacent to the planar section of the metal clip segment 190.

Figure 5H:
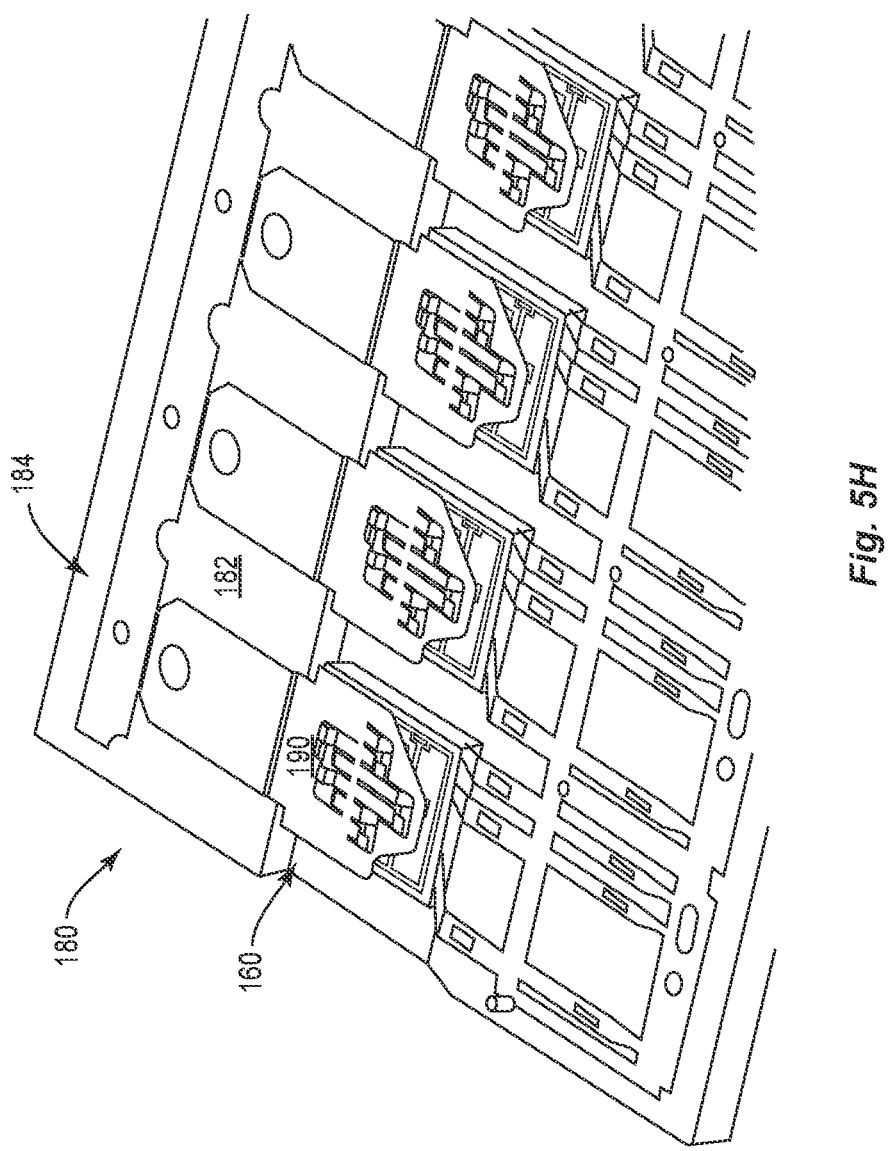

Referring to FIG. 5H, the clip frame strip 184 is arranged over the first lead frame strip 160 on the first soldering tool 180. The clip frame strip 184 is arranged on the shelf 182 such that the metal clip segment 190 extends over the first discrete transistor die 132 and the first discrete diode die 136 and the projections 192 extending downward from the metal clip segment 190 contact the regions of solder material 178 (e.g., as shown in FIG. 5D) on the first discrete transistor die 132 and the first discrete diode die 136. As shown, the clip frame strip 184 may be secured to the first soldering tool 180, e.g., using a fastener such as a screw or pin.

Referring to FIG. 5I, the second lead frame strip 162 is placed on the first soldering tool 180 over the first lead frame strip 160. The second lead frame strip 162 is arranged in such a way that the front surfaces of the second discrete transistor dies 134 face front surfaces of the first discrete transistor dies 132. Likewise, the front surfaces of the first discrete diode dies 136 may face the front surfaces of the second discrete diode dies 138. Moreover, the regions of solder material 178 formed on the terminals of the second discrete transistor dies 134 and the second discrete diode dies 138 are in contact with the projections 192 from the metal clip segment 190. Due to the mirrored geometry of the first and second lead frames as described with reference to FIG. 5A, each of the leads from the first lead frame strip 160 aligns with and is flush against each of leads from the second lead frame strip 162.

After placing the second lead frame strip 162 on the first soldering tool 180 over the first lead frame strip 160 in the above-described manner, a solder reflow step may be performed. The solder reflow step exposes the assembly to reflow temperatures so that the regions of solder material 178 form fused connection with the metal surfaces to which they contact. As a result, the electrical connectivity of the semiconductor package 100 described with reference to FIG. 4 is produced. The unit clips 186 correspond to the connection lug 114 of the semiconductor package 100, a compound lead structure formed by the first lead 143 from the first row 170 and the first lead 143 from the second row 172 corresponds to the first package lead 108 described with reference to FIG. 4, a compound lead structure formed by the second lead 145 from the first row 170 and the second lead 145 from the second row 172 corresponds to the second package lead 110 described with reference to FIG. 4, and a compound lead structure formed by the third lead 147 from the first row 170 and the third lead 147 from the second row 172 corresponds to the third package lead 112 described with reference to FIG. 4.

After performing the solder reflow, a cleaning process may be performed to remove excess flux from the assembly 200, e.g., using a solvent such as an alcohol based solvent. After performing the cleaning process, the peripheral bar 188 of the clip frame strip 184 may be detached from each planar tab 118 such that the unit clips 186 from the clip frame strip 184 are separated from one another. This may be done by cutting, for example. Additionally or alternatively, the clip frame strip 184 may comprise scoring and/or perforations 120 such that the peripheral bar 188 can be easily removed by simple mechanical force.

Figure 5J:
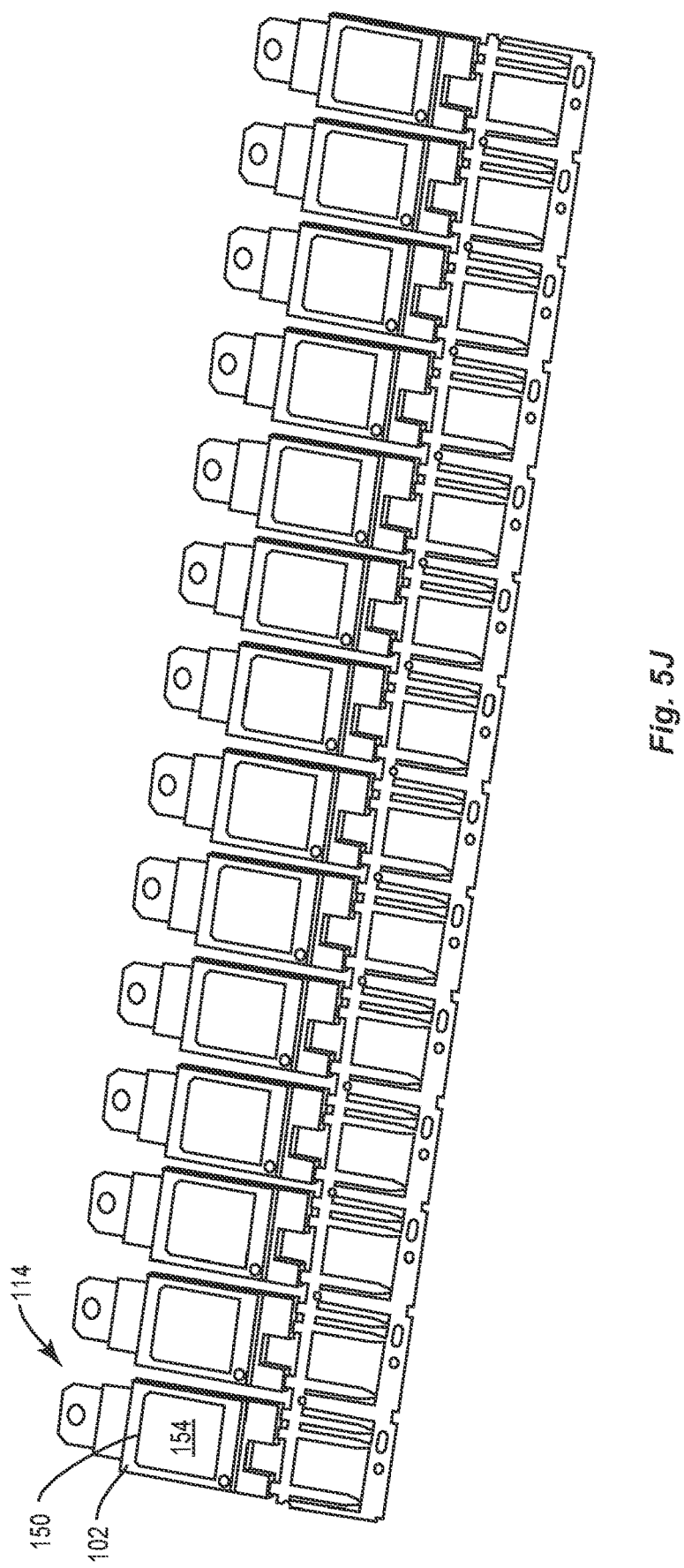

Referring to FIG. 5J, a molding process is performed to form the encapsulant body 102 of each semiconductor package 100. Before forming the encapsulant body 102, an adhesion promotor step may be performed on the lead frames 160, 162, e.g., by applying an adhesion promotor such as silane, or by performing a metal roughening surface treatment. The molding process may involve any molding technique such as injection molding, transfer molding, compression molding, casting, ATC mold, etc. The molding compound used to form the encapsulant body 102 can be electrically conductive, e.g., ceramic filler, $Al_2O_3$, may comprise a nitride, diamond, etc. The encapsulant body 102 be done in 1 encapsulation step (e.g., full-pak) or in 2 encapsulation steps (e.g., in the case of an advanced isolation package or lamination of thermal interface material sheets) The encapsulant body 102 is formed such that the outer surface 154 of the first die pad 150 150 is exposed from the third outer face of the encapsulant body 102 and such that the outer surface 156 of the second die pad 152 is exposed from the fourth outer face of the encapsulant body 102 (e.g., shown in FIG. 4C). This may be done by initially forming the encapsulant body 102 to cover the first and second die pads 150, 152 and subsequently removing encapsulant material, e.g., by planarization or grinding. Alternatively, this may be done by appropriately configuring the mold cavity used to form the encapsulant body 102. After the molding process, a trimming/cutting step may be performed to detach the leads from the lead frame strips and provide discrete semiconductor packages 100.

Referring to FIG. 6, a semiconductor package 100 that comprises multiple discrete transistor dies is depicted, according to another embodiment. Referring to FIG. 6A, the equivalent circuit of the semiconductor package 100 comprises a first load terminal 122, a second load terminal 124, a first control terminal 126, a first sense terminal 130, a second control terminal 194, and a second sense terminal 196. The first voltage blocking terminals 140 of the first and second discrete transistor dies 132, 134 and the anode terminals 146 of the first and second discrete diode dies 136, 138 are each connected to the first load terminal 122. The second voltage blocking terminals 142 of the first and second discrete transistor dies 132, 134 and the cathode terminals 148 of the first and second discrete diode dies 136, 138 are each connected to the second load terminal 124. The gate terminal 144 of the first transistor die 132 is connected to the first control terminal 126. The gate terminal 144 of the second transistor die 134 is connected to the second control terminal 194. The first voltage blocking terminal 140 of the first discrete transistor die 132 is additionally and separately electrically connected to the first sense terminal 130. The first voltage blocking terminal 140 of the second discrete transistor die 138 is additionally and separately electrically connected to the second sense terminal 196. Different to the embodiment of FIG. 4A, in this embodiment the first and second first and second discrete transistor dies 132, 134 are independently controllable via the first and second control terminals 126, 194, respectively, and the load voltages of the first and second discrete transistor dies 132, 134 are independently detectable vie the first and second sense terminals 130, 196 respectively.

Figure 6E:
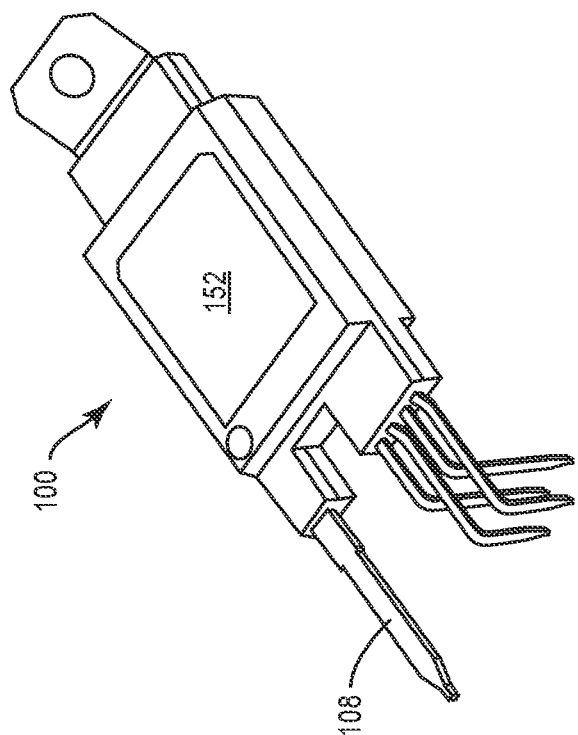
Figure 6D:
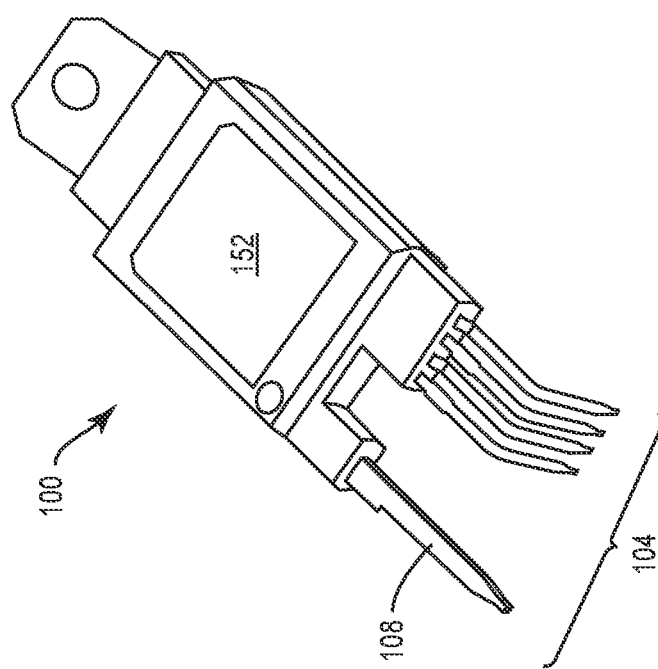

Referring to FIGS. 6B and 6C, the semiconductor package 100 comprises five package leads 104 protruding out from the first outer face 106 of the encapsulant body 102, namely, a first package lead 108, a second package lead 110 a third package lead 112, a fourth package lead 198, and a fifth package lead 200, and comprises a connection lug 114 protruding out from the second outer face 116 of the encapsulant body 102. The semiconductor package 100 may have the following correspondence to the circuit described with reference to FIG. 6A. The connection lug 114 may correspond to the first load terminal 122, the first package lead 108 may correspond to the second load terminal 124, the second package lead 110 may correspond to the first control terminal 126, the third package lead 112 may correspond to the second control terminal 194, the fourth package lead 198 may correspond to the first sense terminal 130, and the fifth package lead 200 may correspond to the second sense terminal 194. FIGS. 6D and 6E depict corresponding package configurations wherein the package leads 104 are bent.

Referring to FIG. 7, selected processing steps for forming the semiconductor package 100 described with reference to FIG. 6 are depicted, according to an embodiment. In addition to the steps discussed below with reference to FIG. 7, the processing steps of FIG. 7 may include any of the processing steps for forming the semiconductor package 100 described herein, except where inconsistent with the discussion with reference to FIG. 8.

Figure 7A:
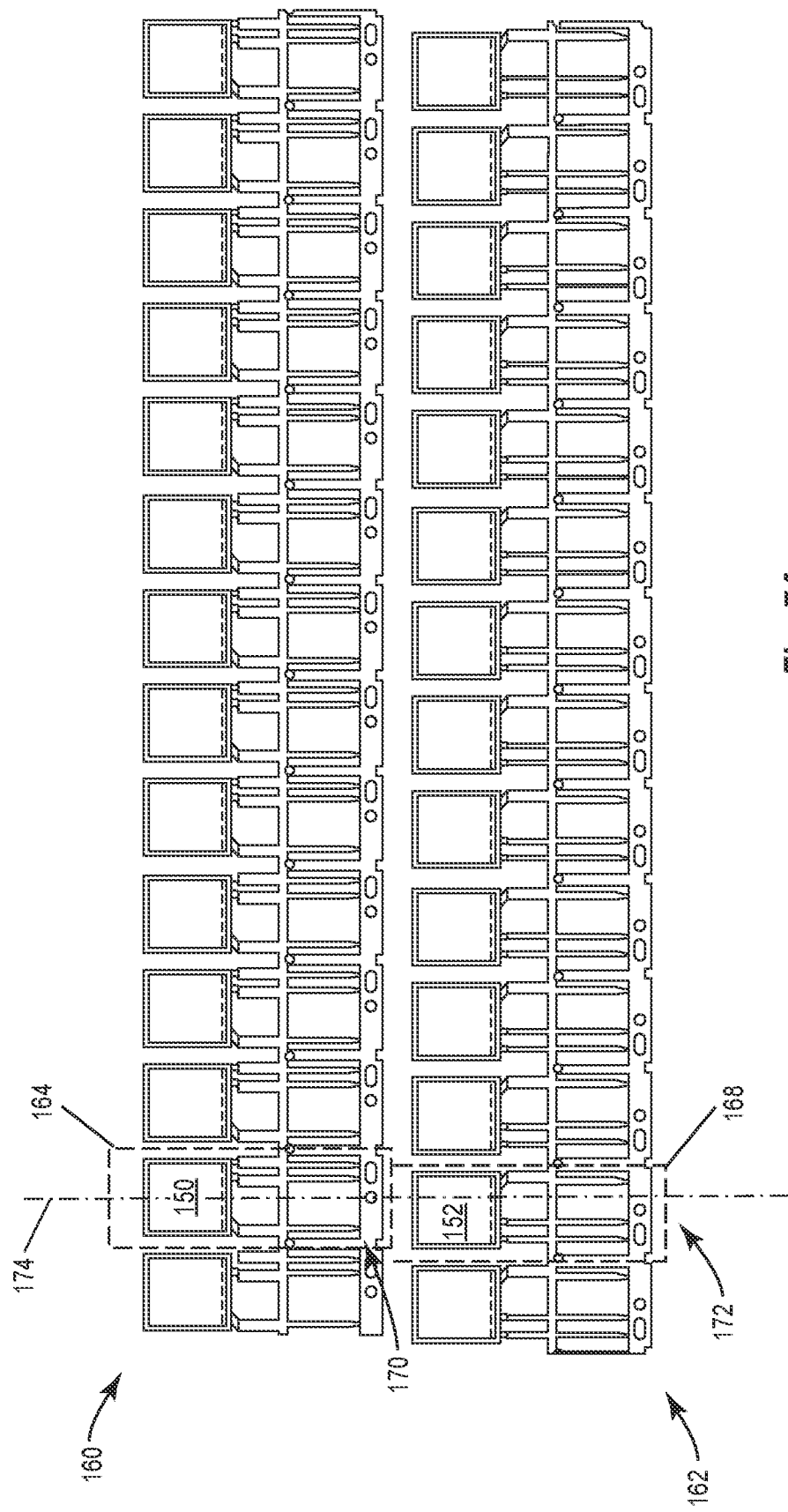
FIGS. 7A-7G, illustrates selected method steps for forming a semiconductor package, according to an embodiment.

Referring to FIG. 7A, a first lead frame strip 160 and a second lead frame strip 162 are provided. In this case, the first and second unit lead frames 168 are asymmetric with respect a central plane 174 such that second and third leads 145, 147 from the first row 170 of leads are laterally offset from second and third leads 145, 147 (identified in FIG. 7B) from the second row 172 of leads (identified in FIG. 7C), with respect to the central plane 174. However, first leads 143 from the first row 170 (identified in FIG. 7B) of leads mirror first leads from the second row 172 (identified in FIG. 7C), with respect to the central plane 174. Thus, the first lead frame strip 160 and the second lead frame strip 162 are configured so that some of the leads mirror one another, while others are laterally offset from the mirror image lead locations.

Figure 7B:
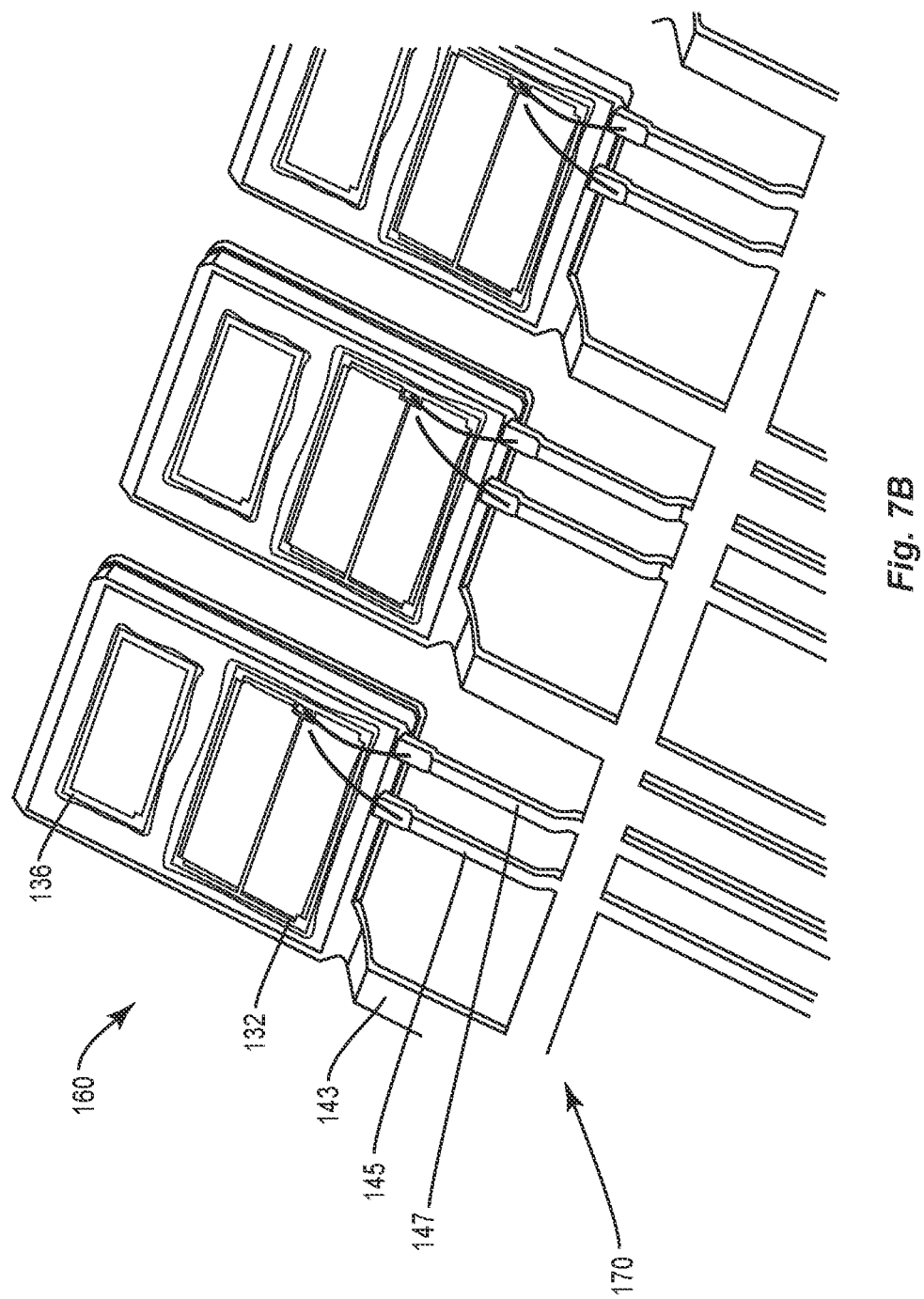
Figure 7C:
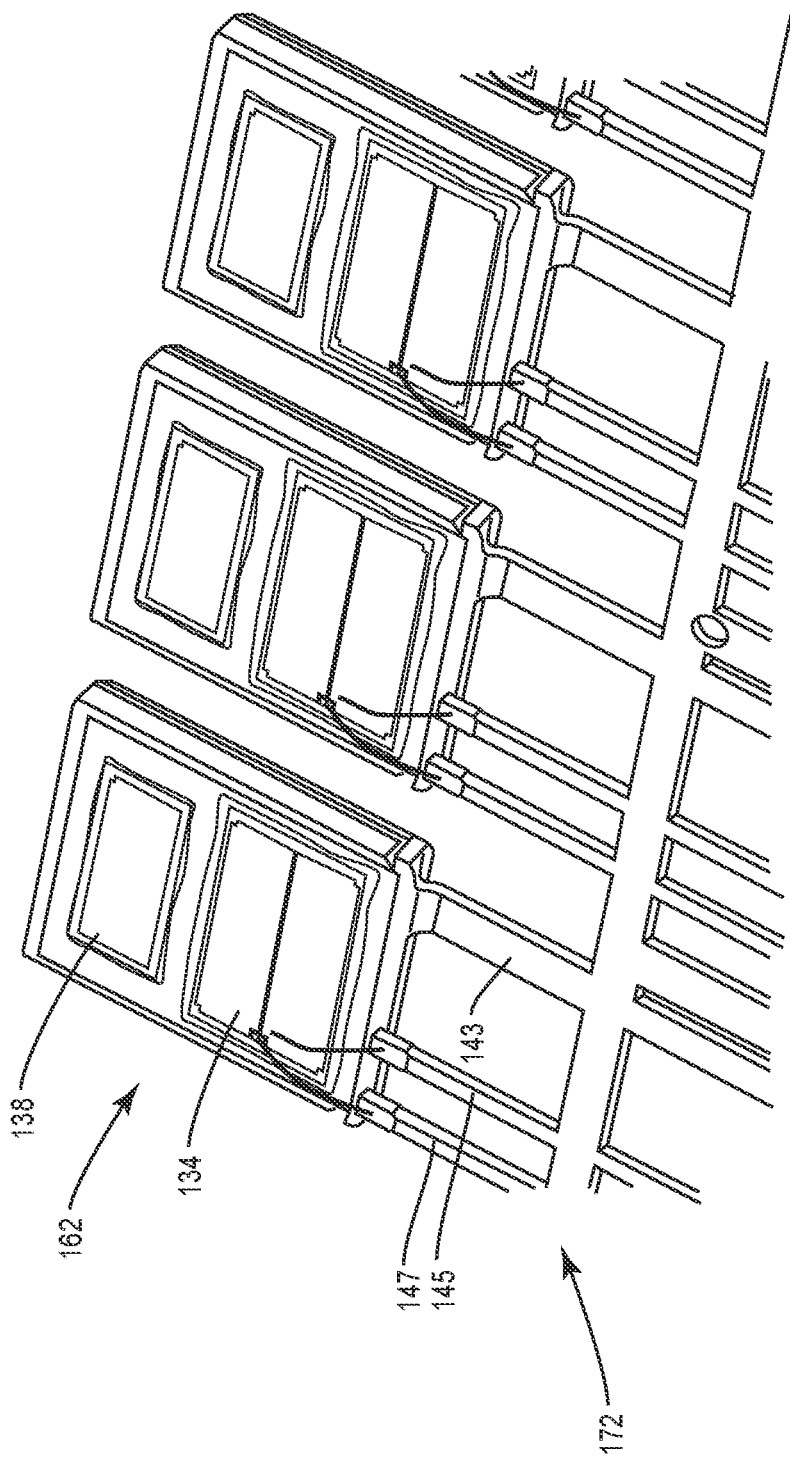

Referring to FIGS. 7B and 7C, die mounting and wire bonding steps are performed. As shown in FIG. 7B, the first discrete transistor dies 132 and the first discrete diode dies 136 are mounted on the first lead frame strip 160 and the electrical connections to the first row 170 of leads are formed in a similar manner as previously described. As shown in FIG. 7C, the second discrete transistor dies 134 and the second discrete diode dies 138 are mounted on the second lead frame strip 162 and the electrical connections to the second row 172 of leads are formed in a similar manner as previously described.

Figure 7D:
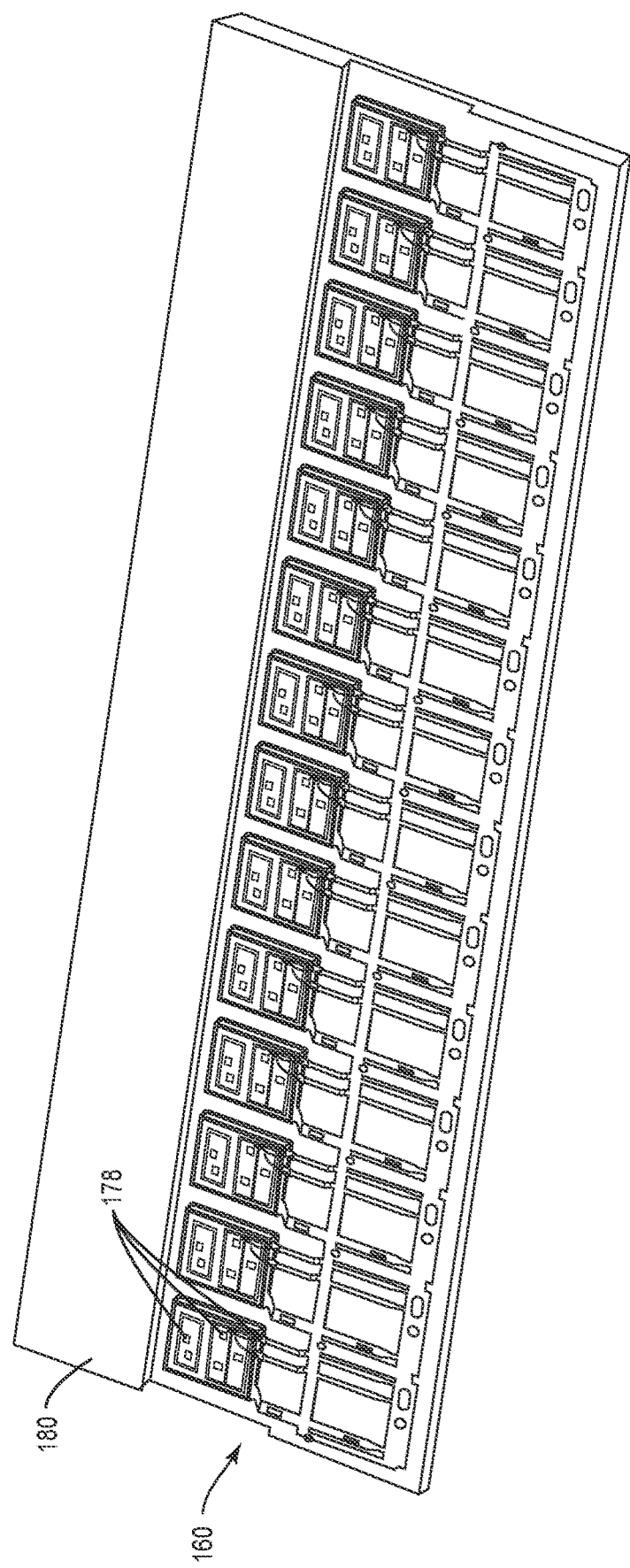

Referring to FIG. 7D, a solder application step is performed so that regions of solder material 178 are applied to upward facing conducive surfaces on both of the first lead frame strip 160 and the second lead frame strip 162 in a similar manner as previously described. The first lead frame strip 160 with the semiconductor dies mounted thereon is placed on a first soldering tool 180 in a similar manner as previously described.

Figure 7E:
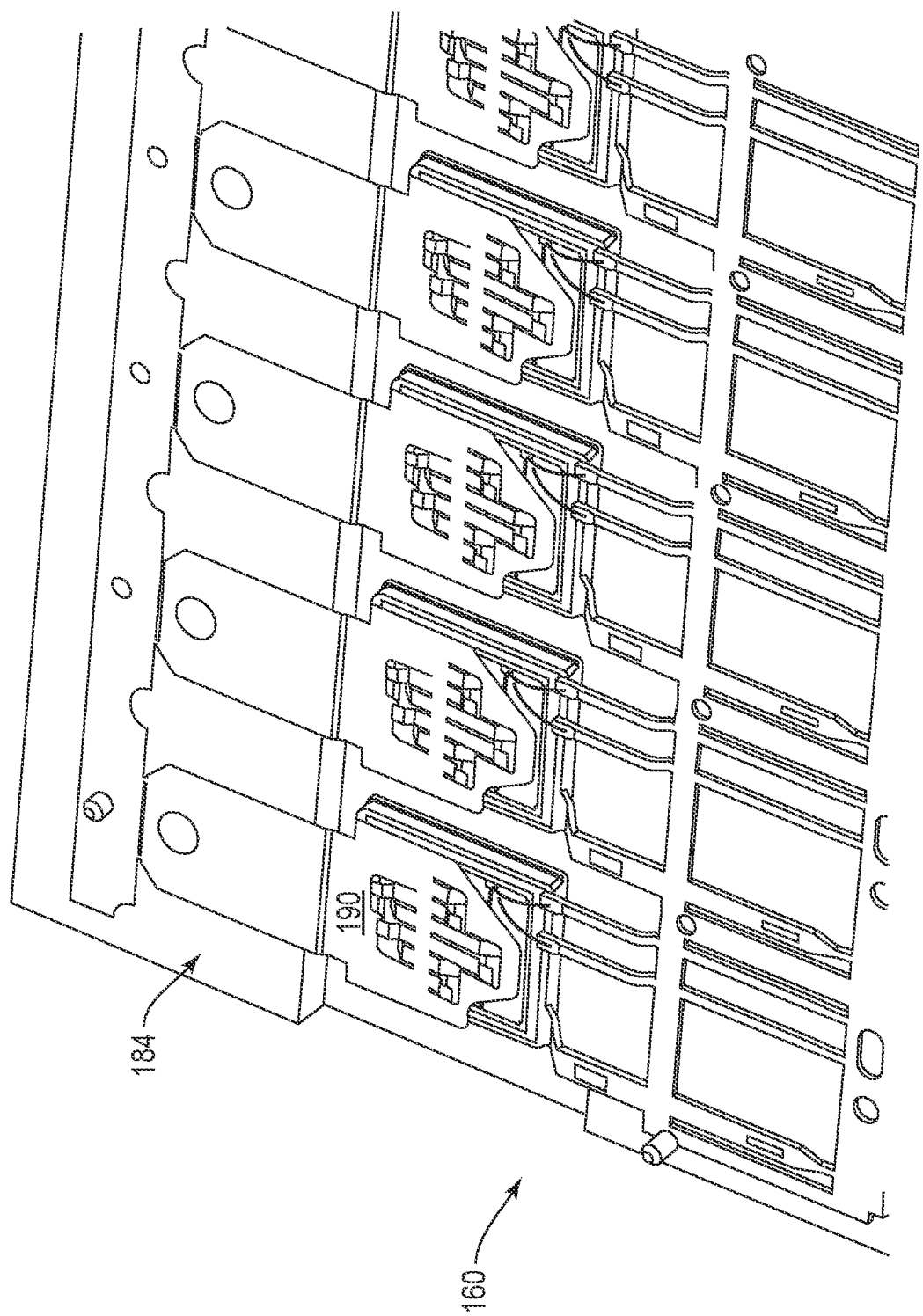

Referring to FIG. 7E, a clip frame strip 184 is provided and the clip frame strip 184 is arranged over the first lead frame strip 160 on the first soldering tool 180 in a similar manner as previously described.

Figure 7F:
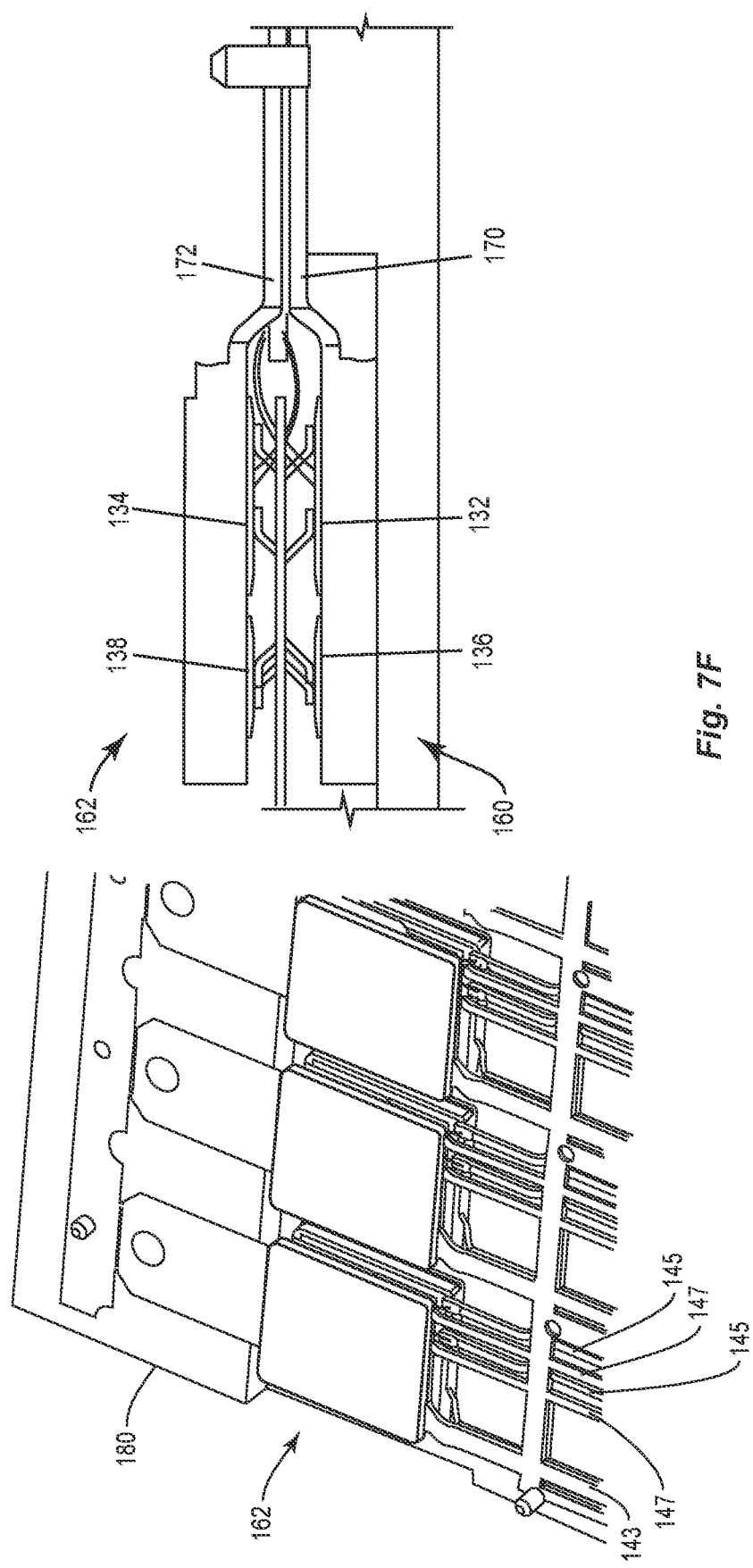

Referring to FIG. 7F, the second lead frame strip 162 is placed on the first soldering tool 180 over the first lead frame strip 160. Due to the geometry of the first and second unit lead frames 168 as previously described with reference to FIG. 7A, the second and third leads 145, 147 from the first row 170 of leads are interdigitated between the second and third leads 145, 147 from the first row 172. Meanwhile, the first lead 143 from the first row 170 of leads aligns with and is flush against the first lead 143 from the second row 172 of leads in a similar manner as previously described. After placing the second lead frame strip 162 on the first soldering tool 180 over the first lead frame strip 160 in the above-described manner, a solder reflow step is performed. As a result, the electrical connectivity of the semiconductor package 100 described with reference to FIG. 6 is produced. The unit clips 186 correspond to the connection lug 114 of the semiconductor package 100 described with reference to FIG. 4, a compound lead structure formed by a first lead 143 from the first row 170 and a first lead 143 from the second row 172 corresponds to the first package lead 108 described with reference to FIG. 6, a second lead 145 from the first row 170 corresponds to the second package lead 110 described with reference to FIG. 6, a second lead 145 from the second row 172 corresponds to the third package lead 112 described with reference to FIG. 6, a third lead 147 from the first row 170 corresponds to the fourth package lead 198 described with reference to FIG. 6, and a third lead 147 from the second row 172 corresponds to the fifth package lead 200 described with reference to FIG. 6.

Figure 7G:
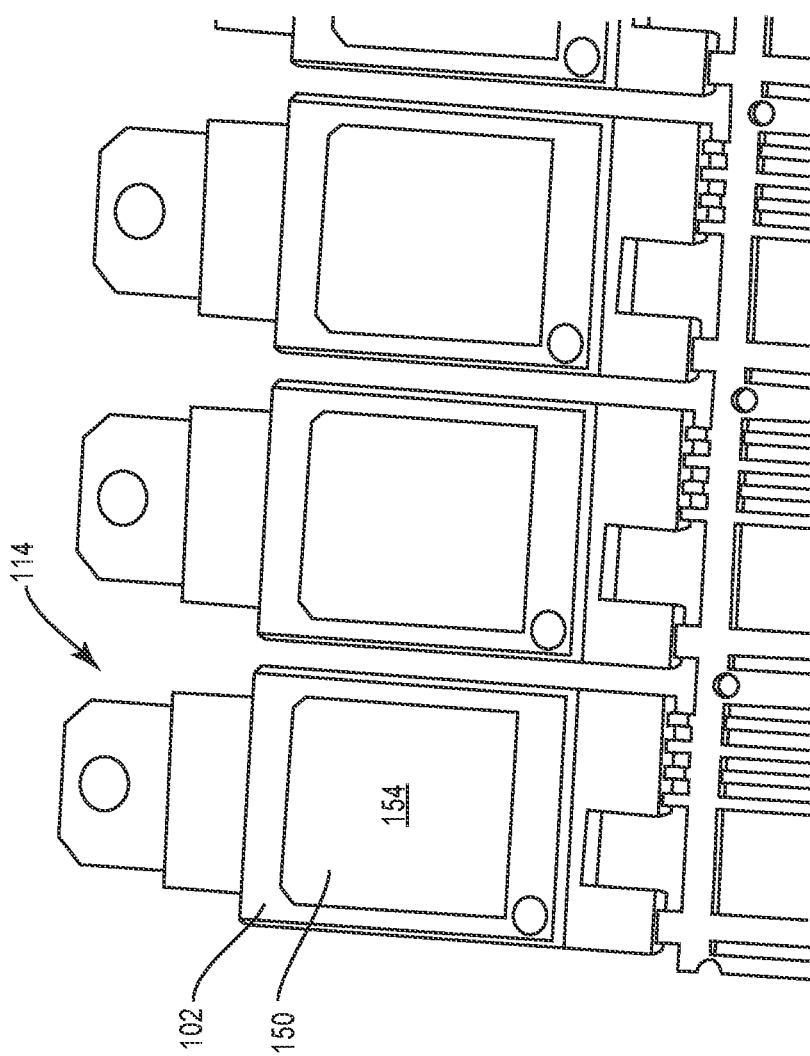

Referring to FIG. 7G, a molding process is performed to form the encapsulant body 102 of the semiconductor package 100 in a similar manner as previously described.

Figure 8A:
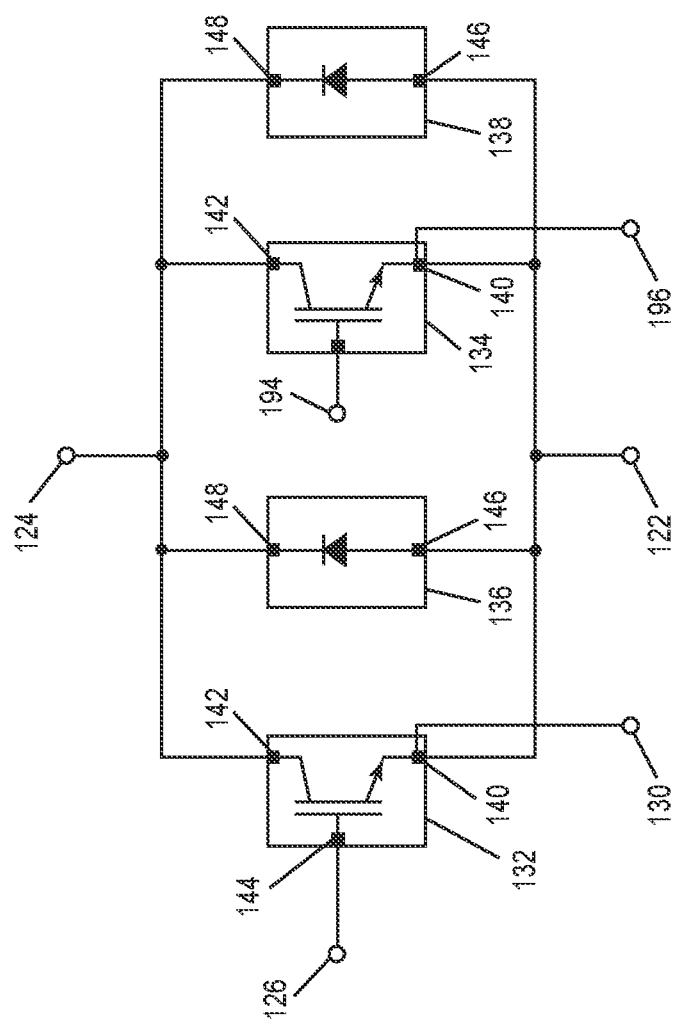
FIGS. 8A-8C, illustrates a semiconductor package that is configured as a discrete switching device, according to an embodiment.

Referring to FIG. 8, a semiconductor package 100 that comprises multiple discrete transistor dies is depicted, according to another embodiment. Referring to FIG. 8A, the equivalent circuit of the semiconductor package 100 comprises a first load terminal 122, a second load terminal 124, a first control terminal 126, a first sense terminal 130, a second control terminal 194, and a second sense terminal 196. The first voltage blocking terminals 140 of the first and second discrete transistor dies 132, 134 and the anode terminals 146 of the first and second discrete diode dies 136, 138 are each connected to the first load terminal 122. The second voltage blocking terminals 142 of the first and second discrete transistor dies 132, 134 and the cathode terminals 148 of the first and second discrete diode dies 136, 138 are each connected to the second load terminal 124. The gate terminal 144 of the first transistor die 132 is connected to the first control terminal 126. The gate terminal 144 of the second transistor die 134 is connected to the second control terminal 194. The first voltage blocking terminal 140 of the first discrete transistor die 132 is additionally and separately electrically connected to the first sense terminal 130. The first voltage blocking terminal 142 of the second discrete transistor die 138 is additionally and separately electrically connected to the second sense terminal 196. In a difference to the embodiment described with reference to FIG. 6, in this circuit the first and second sense terminals 130, 196, are connected to the opposite side of the transistor dies, e.g., the emitter terminal in the case of an IGBT, the source terminal in the case of an MOSFET, etc.

Figure 8C:
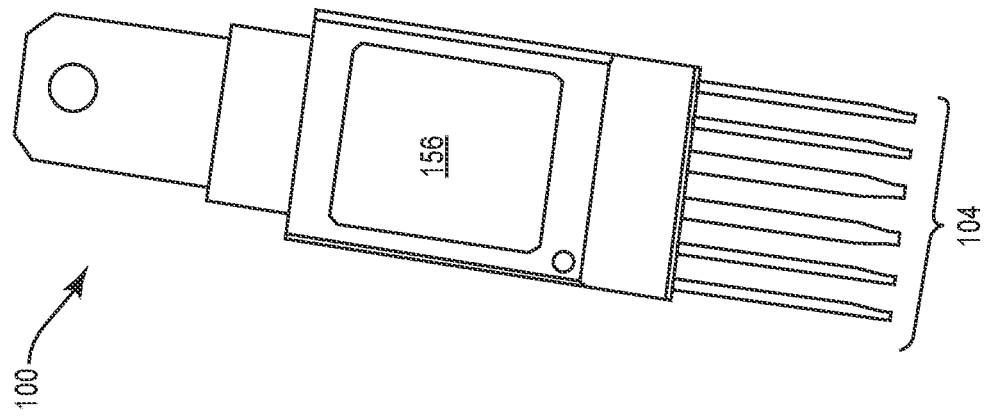
Figure 8B:
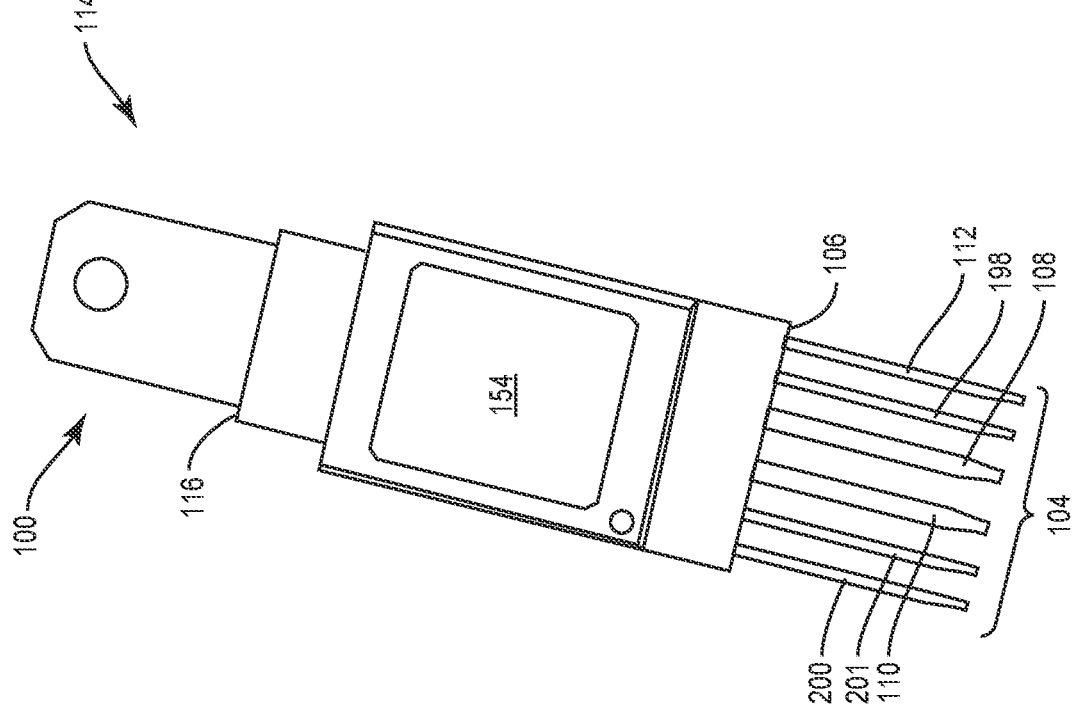

Referring to FIGS. 8B and 8C, the semiconductor package 100 comprises six package leads 104 protruding out from the first outer face 106 of the encapsulant body 102, namely, a first package lead 108, a second package lead 110 a third package lead 112, a fourth package lead 198, a fifth package lead 200, and a sixth package lead 201, and comprises a connection lug 114 protruding out from the second outer face 116 of the encapsulant body 102. The semiconductor package 100 may have the following correspondence to the circuit described with reference to FIG. 8A. The connection lug 114 may correspond to the second load terminal 124, the first and second package leads 108, 110 may each correspond to the first load terminal 122, the third package lead 112 may correspond to the first control terminal 126, the fourth package lead 198 may correspond to the first sense terminal 130, the fifth package lead 200 may correspond to the second control terminal 194, and the sixth package lead 201 may correspond to the second sense terminal 194. Thus, the semiconductor package 100 differs from the previous embodiments in that the connection lug 114 corresponds to the opposite load terminal (e.g., the collector terminal in the case of an IGBT, the drain terminal in the case a MOSFET, etc.).

Figure 9:
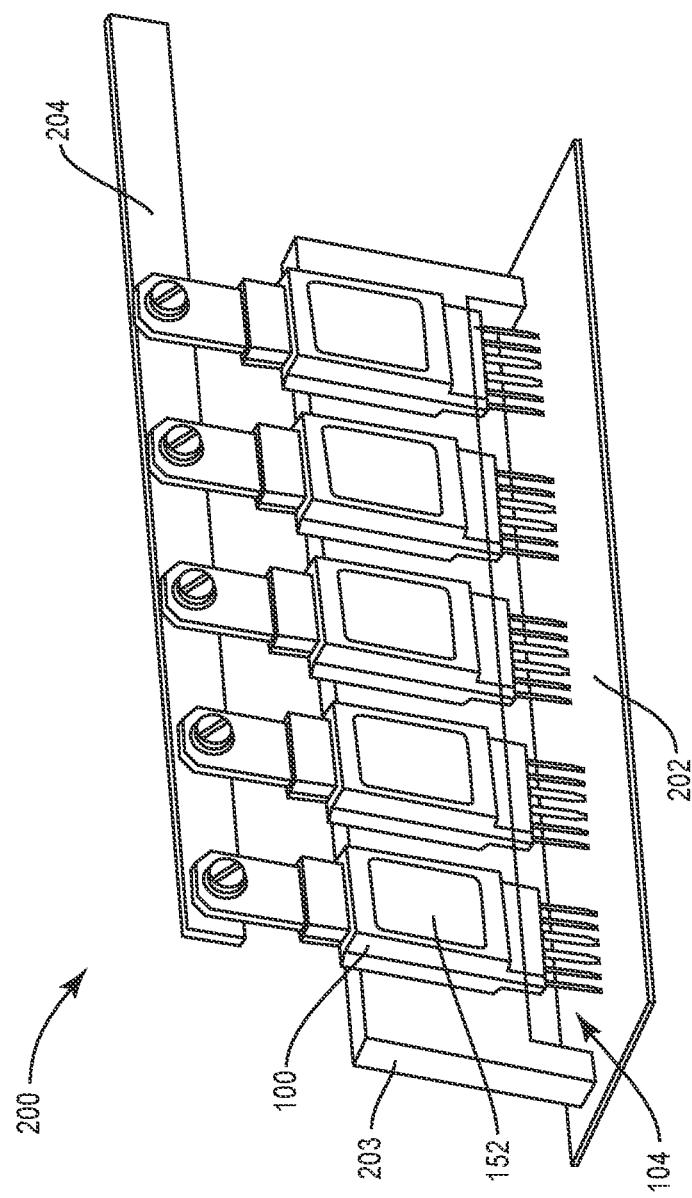
FIG. 9 illustrates an assembly with multiple semiconductor packages arranged on a circuit board and a busbar that is connected to a connection lug of each semiconductor package, according to an embodiment.

Referring to FIG. 9, an assembly 200 that comprises multiples ones of the semiconductor packages 100 described with reference to FIG. 8 is depicted, according to an embodiment. The assembly 200 comprises a circuit carrier 202, which may be a PCB, DCB substrate, AMB substrate, etc. Each of the semiconductor packages 100 are mounted on the circuit carrier 202 with the package leads 104 being inserted into correspondingly dimensioned receptacles in the circuit carrier 200. The assembly 200 comprises a busbar 204 that is connected to the connection lugs 114 of each semiconductor packages 100. In this example, the busbar 204 may be configured to provide a fixed potential to each semiconductor packages 100, e.g., a reference potential such as GND. Moreover, the busbar 204 is configured as a heat extraction device, as it is an electrically conductive structure that is attached the connection lugs 114, which in turn are connected to the package die pads (e.g., as will be demonstrated below). Meanwhile, the circuit carrier 202 may provide a fixed potential to each semiconductor packages 100, e.g., a source potential such as 500V, 100V, etc., via the first and second package leads 108, 110. The assembly 200 additionally comprises a heat sink 203. The heat sink 203 contacts the first die pad 150 of each of the semiconductor packages 100 so as to extract heat during operation. An additional heat sink may be provided to contact the second die pad 152 of each of the semiconductor packages for further cooling capability.

Referring to FIG. 10, selected processing steps for forming the semiconductor package 100 described with reference to FIG. 8 are depicted, according to an embodiment. In addition to the steps discussed below with reference to FIG. 10, the processing steps of FIG. 10 may include any of the processing steps for forming the semiconductor package 100 described herein, except where inconsistent with the discussion with reference to FIG. 10.

Referring to FIG. 10A, first and second lead frame strips 160, 162 are provided. In this case, the first and second lead frame strip 160, 162 have an identical die pad and lead frame configuration. That is, from a plan-view perspective of the first and second lead frame strips 160, 162, the first row 170 of leads and the first die pad 150 from the first unit lead frames 164 have the same geometry as the second row 172 of leads and the second die pad 152 from the second unit lead frames 162. Moreover, the first and second unit lead frames 168 are each configured so that the leads are disposed within one lateral half of the respective unit lead frame. That is, the leads are disposed to the side of (the left side as shown) a central plane 174 that extends parallel to the leads. At least one or both of the first and second unit lead frames 164, 168 may have a downset configuration wherein outer portions of the leads are disposed below the respective die pad to which they are associated with.

In the embodiment of FIG. 10, the first unit lead frames 160 are each configured to comprise a first planar tab 118 that is continuously connected to the first die pad 150, and the second unit lead frames 162 are each configured to comprise a second planar tab 118 that is continuously connected to the second die pad 152. Thus, the first and second unit lead frames 160, 162 each comprise a protruding clip structure that provides the features of the connection lug 114 as previously described.

Figure 10B:
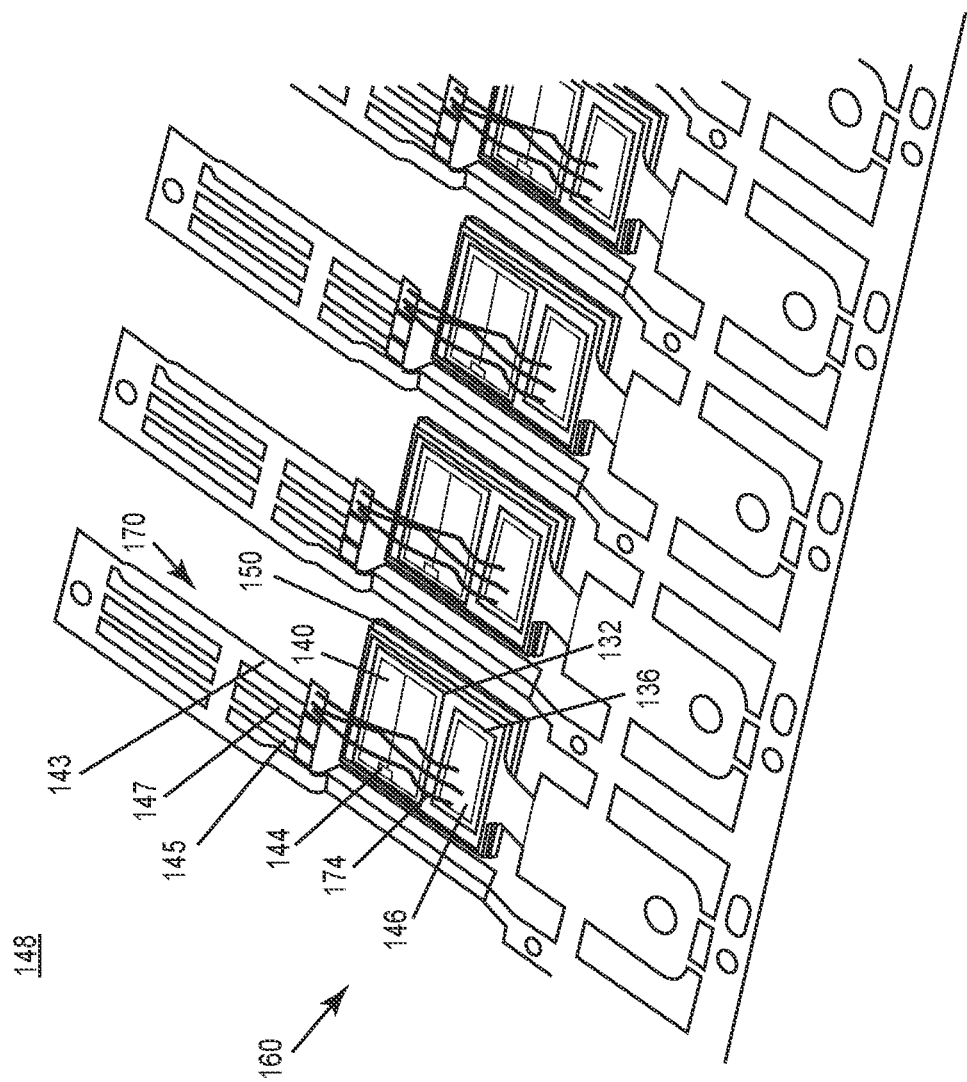

Referring to FIG. 10B, die mounting and wire bonding steps are performed with respect to the first discrete transistor die 132 and the first discrete diode 136 on the first unit lead frames 160. The first discrete transistor die 132 and the first discrete diode 136 are each mounted on the first die pad 150 in a similar manner as previously described. In this case, the second voltage blocking terminal 142 of the first discrete transistor die 132 and the anode terminal 148 (not seen in the figure) of the first discrete diode 136 face and electrically connect with the first die pads 150. Meanwhile, the first voltage blocking terminal 140 and the gate terminal 144 of the first discrete transistor die 132 is disposed on a front surface of the first discrete transistor die 132 that faces away from the first die pad 150. Likewise, the anode 146 of the first discrete diode 136 is on a front surface of the first discrete diode 136 that faces away from the first die pad 150. The first voltage blocking terminal 140 of the first discrete transistor die 132 and the anode 146 of the first discrete diode 136 are electrically connected to a first one 143 of the leads from the first row 170 of leads by a group of bond wires 174. The gate terminal 144 of the first discrete transistor die 132 is electrically connected to a second one 145 of the leads from the first row 170 by a bond wire 174, and the first voltage blocking terminal 140 of the first discrete transistor die 132 is electrically connected to a third one 147 of the leads from the first row 170 by a bond wire 174.

Figure 10C:
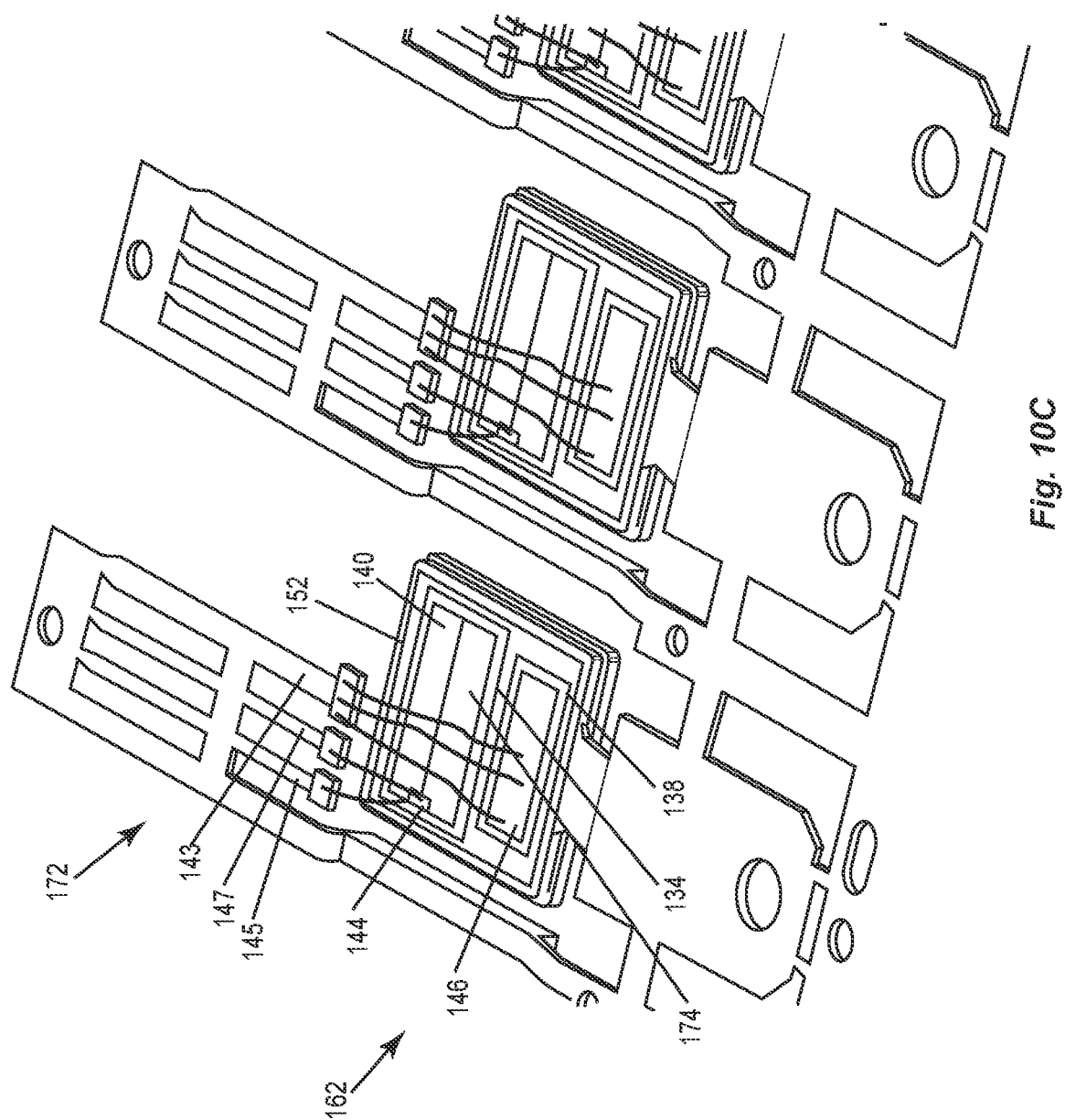

Referring to FIG. 10C, die mounting and wire bonding steps are performed with respect to the second discrete transistor die 134 and the second discrete diode 138 on the second unit lead frames 162. This may be done according to the same steps described with reference to FIG. 10B.

Figure 10D:
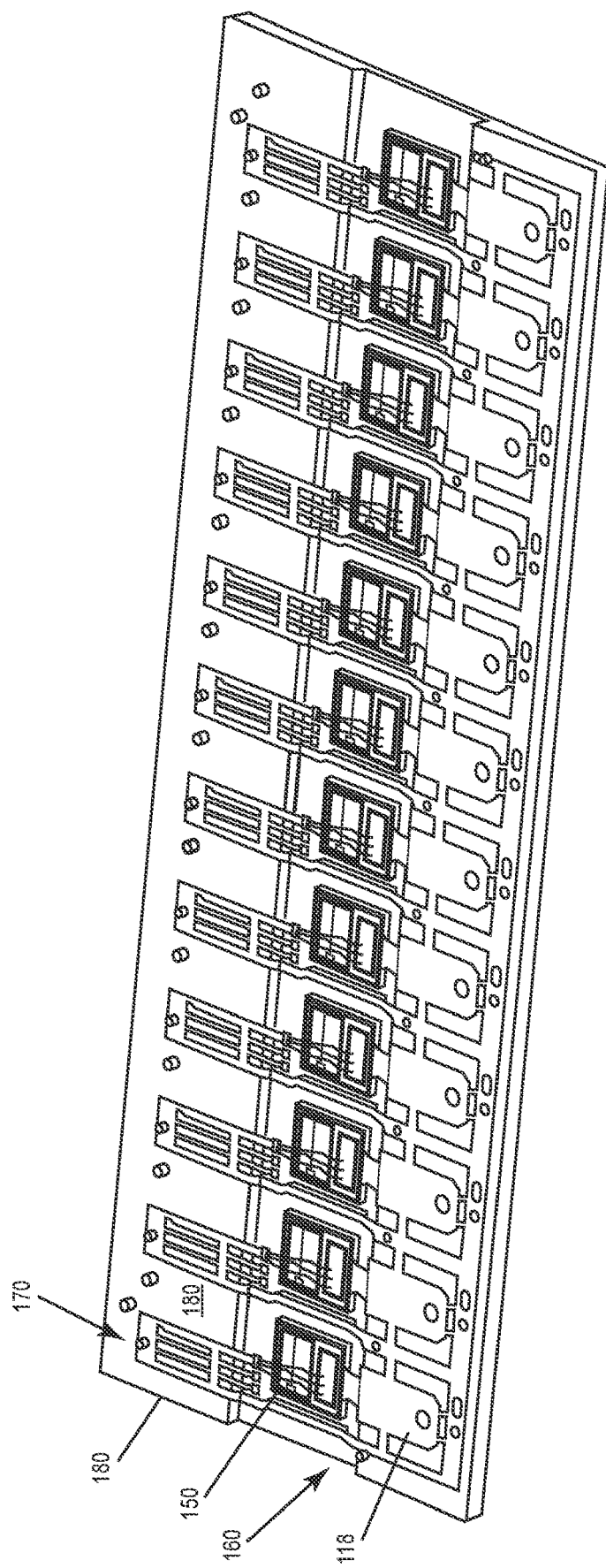

Referring to FIG. 10D, the first lead frame strip 160 with the semiconductor dies mounted thereon is placed on a first soldering tool 180. As shown, the portion of the first lead frame strip 160 comprising the first die pad 150 and the first planar tab 118 are disposed on a lower section of the first soldering tool 180 and the first row 170 of leads is disposed on the shelf 182 of the first soldering tool 180. The first lead frame strip 160 may be secured to the first soldering tool 180 using fasteners in a similar manner as previously described. Optionally, regions of solder material 178 (not shown) may be provided in addition to the existing solder for the semiconductor dies and/or wire bonds so as to enhance adhesion and electrical connectivity in the subsequent steps. For instance, regions of solder material 178 may be provided on the first planar tab 118.

Figure 10E:
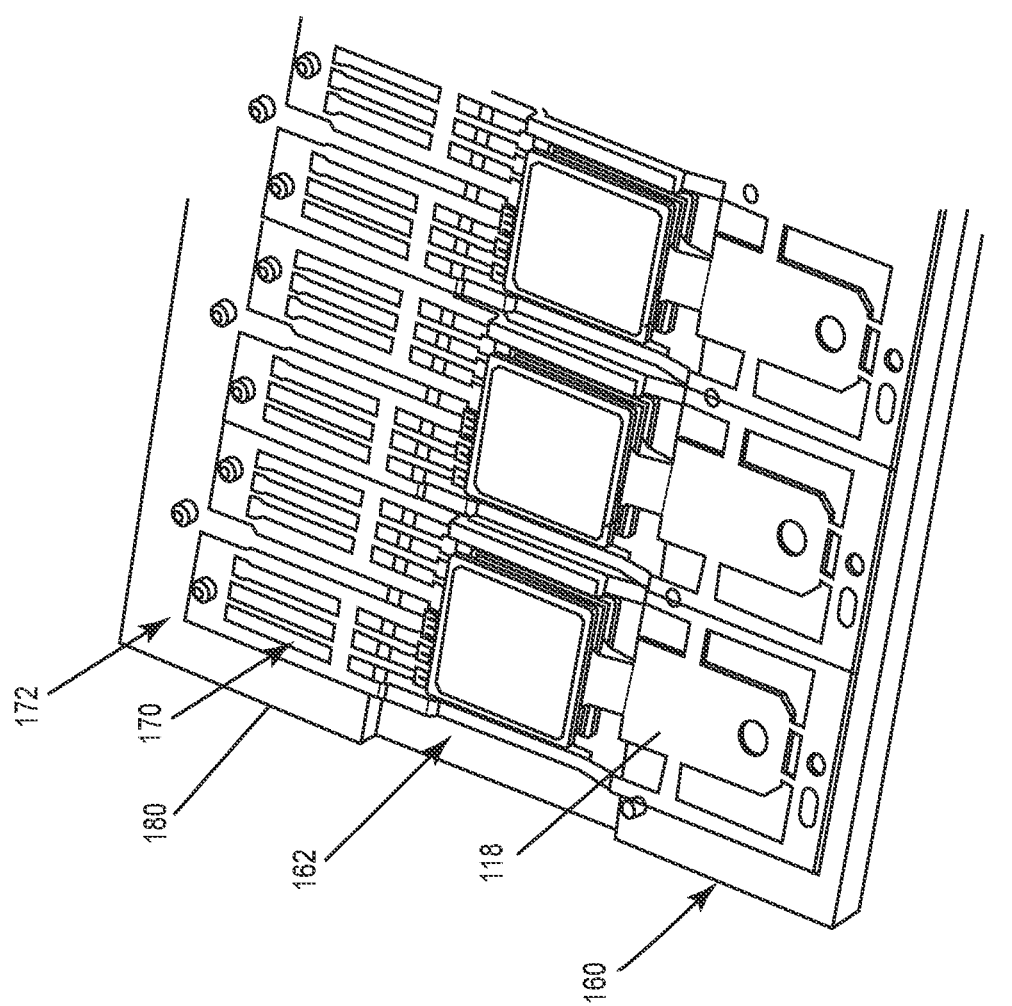

Referring to FIG. 10E, the second lead frame strip 162 is placed on the first soldering tool 180 over the first lead frame strip 160. The second frame strip is arranged such that first and second die pads 150, 152 face one another and the front surfaces of the semiconductor dies face one another in a similar manner as previously described. Different to the previous embodiments, there is no clip interposed between the semiconductor dies. The geometry of the first lead frame strip 160 and the geometry of the second lead frame strip 162 produce the following arrangement. The first planar tab 118 from the first lead frame strip 160 aligns with and is flush against the first planar tab 118 from the second lead frame strip 160. Moreover, the first row 170 of leads from the first lead frame strip 160 are arranged side-by side with the second row 172 of leads from the second lead frame strip 162, thus forming a single row of six leads. Optionally, the first leads 143 from the first row 170 may contact the first leads 143 from the second row 172, thus forming two leads that are electrically connected to another. Alternatively, these leads may remain separated.

After placing the second lead frame strip 162 on the first soldering tool 180 over the first lead frame strip 160 in the above-described manner, a solder reflow step may be performed to reflow any solder (if present). As a result, the electrical connectivity of the semiconductor package 100 described with reference to FIG. 8 is produced. A compound connection lug formed from the first planar tab 118 of the first lead frame strip 160 and the second planar tab 118 of the second lead frame strip 160 correspond to the connection lug 114, the first lead 143 from the first row 170 corresponds to the first package lead 108, the first lead 143 from the second row 172 corresponds to the second package lead 110, the second lead 145 from the first row 170 corresponds to the third package lead 110, the third lead 147 from the first row 170 corresponds to the fourth package lead 198, the second lead 145 from the second row 172 corresponds to the fifth package lead 200, the third lead 147 from the second row 172 corresponds to the sixth package lead 201.

Figure 10F:
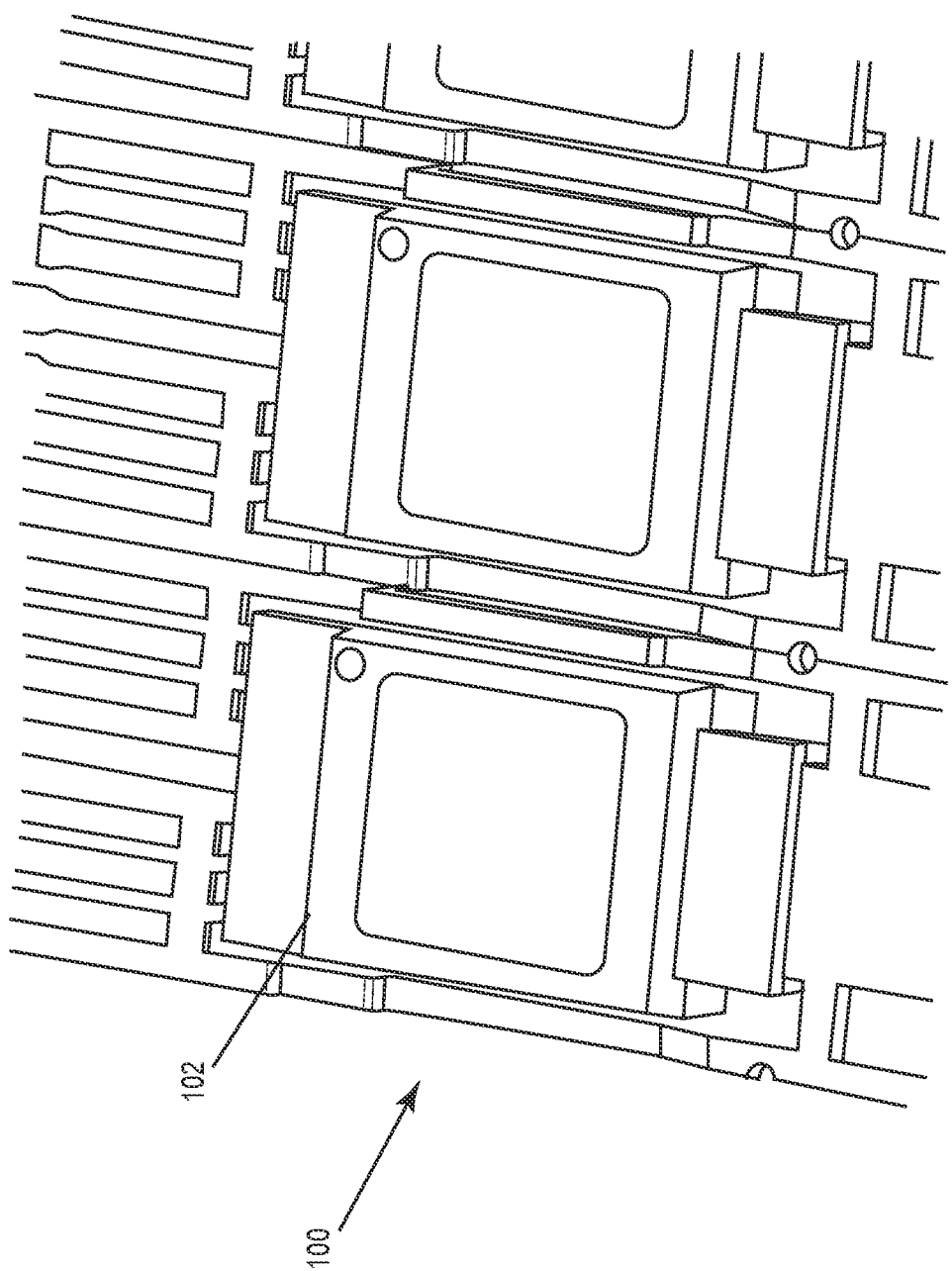

Referring to FIG. 10F, a molding process is performed to form the encapsulant body 102 of the semiconductor package 100 in a similar manner as previously described.

Figure 11A:
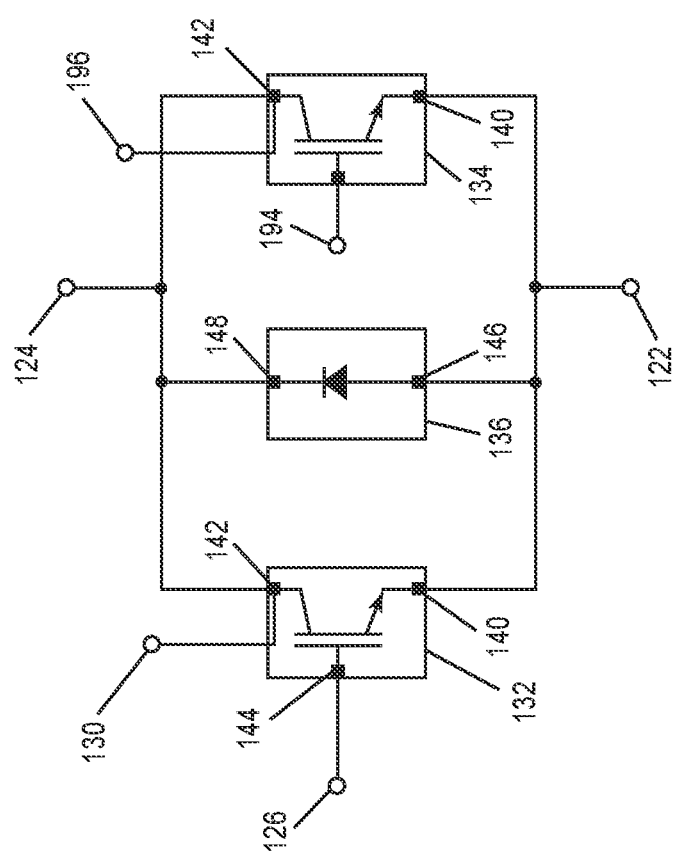
FIGS. 11A-11C, illustrates a semiconductor package that is configured as a discrete switching device, according to an embodiment.

Referring to FIG. 11, a semiconductor package 100 that comprises multiple discrete transistor dies is depicted, according to another embodiment. Referring to FIG. 11A, the equivalent circuit of the semiconductor package 100 is identical to the schematic described with reference to FIG. 8A, except that the second discrete diode die 138 has been omitted such that the semiconductor package 100 only comprises first discrete diode die 136. Thus, the first discrete diode die 136 accommodates the entire reverse conduction current. This configuration may be preferable to save die pad area, as will be evidenced below.

Figure 11C:
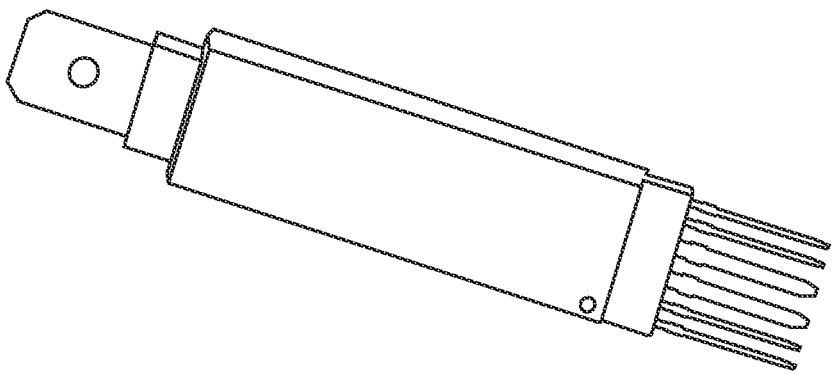
Figure 11B:
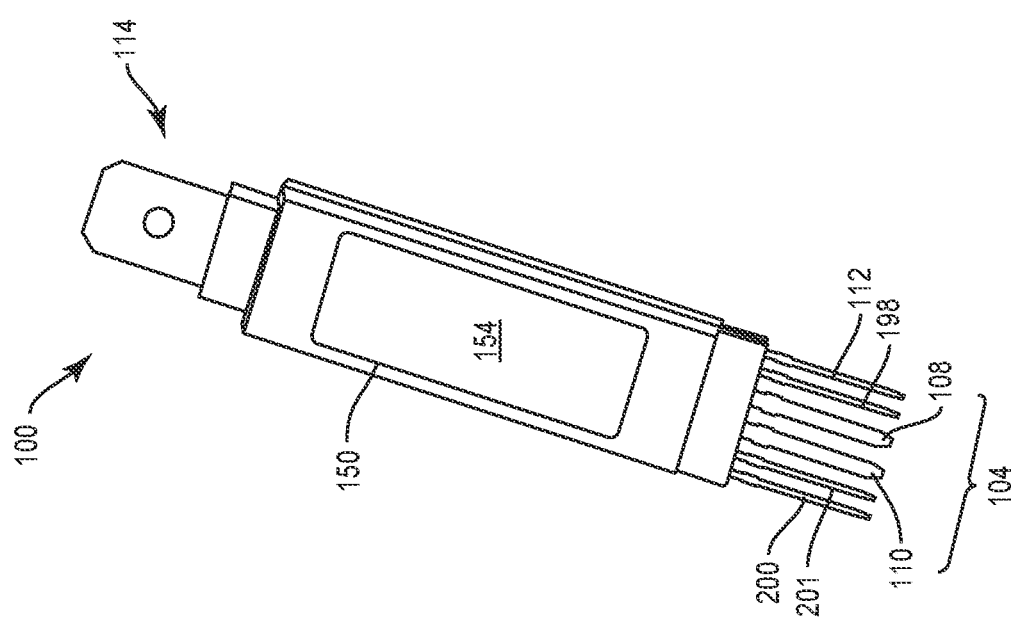

Referring to FIGS. 11B and 11C, the semiconductor package 100 comprises six package leads 104 protruding out from the first outer face 106 of the encapsulant body 102, namely, a first package lead 108, a second package lead 110 a third package lead 112, a fourth package lead 198, a fifth package lead 200, and a sixth package lead 201, and comprises a connection lug 114 protruding out from the second outer face 116 of the encapsulant body 102. The connection lug 114 and the first, second, third, fourth, fifth and sixth package leads 108, 110, 112, 198, 200, 201 may each have the same connectivity as the correspondingly described elements of the semiconductor package 100 described with reference to FIG. 8, except that the second discrete diode die 138 is omitted.

Different to the previously described embodiments, in this embodiment the semiconductor package 100 comprises a single first die pad 150. As will be demonstrated in the following discussion relating to a method for forming the semiconductor package 100, each of the first and second discrete transistor dies 132, 134 and the discrete diode die 134 are mounted on a single die pad. An outer surface 154 of the first die pad 150 is exposed from the third outer face of the encapsulant body 102 as previously described. As shown in FIG. 11C, the fourth outer face of the encapsulant body 102 does not include an exposed die pad. Thus, the semiconductor package 100 has a single-sided cooling configuration wherein heat can be extracted via a heat sink containing the outer surface 154 of the first die pad 150 150.

Referring to FIG. 12, selected processing steps for forming the semiconductor package 100 described with reference to FIG. 11 are depicted, according to an embodiment. In addition to the steps discussed below with reference to FIG. 12, the processing steps of FIG. 12 may include any of the processing steps for forming the semiconductor package 100 described herein, except where inconsistent with the discussion with reference to FIG. 12.

Figure 12A:
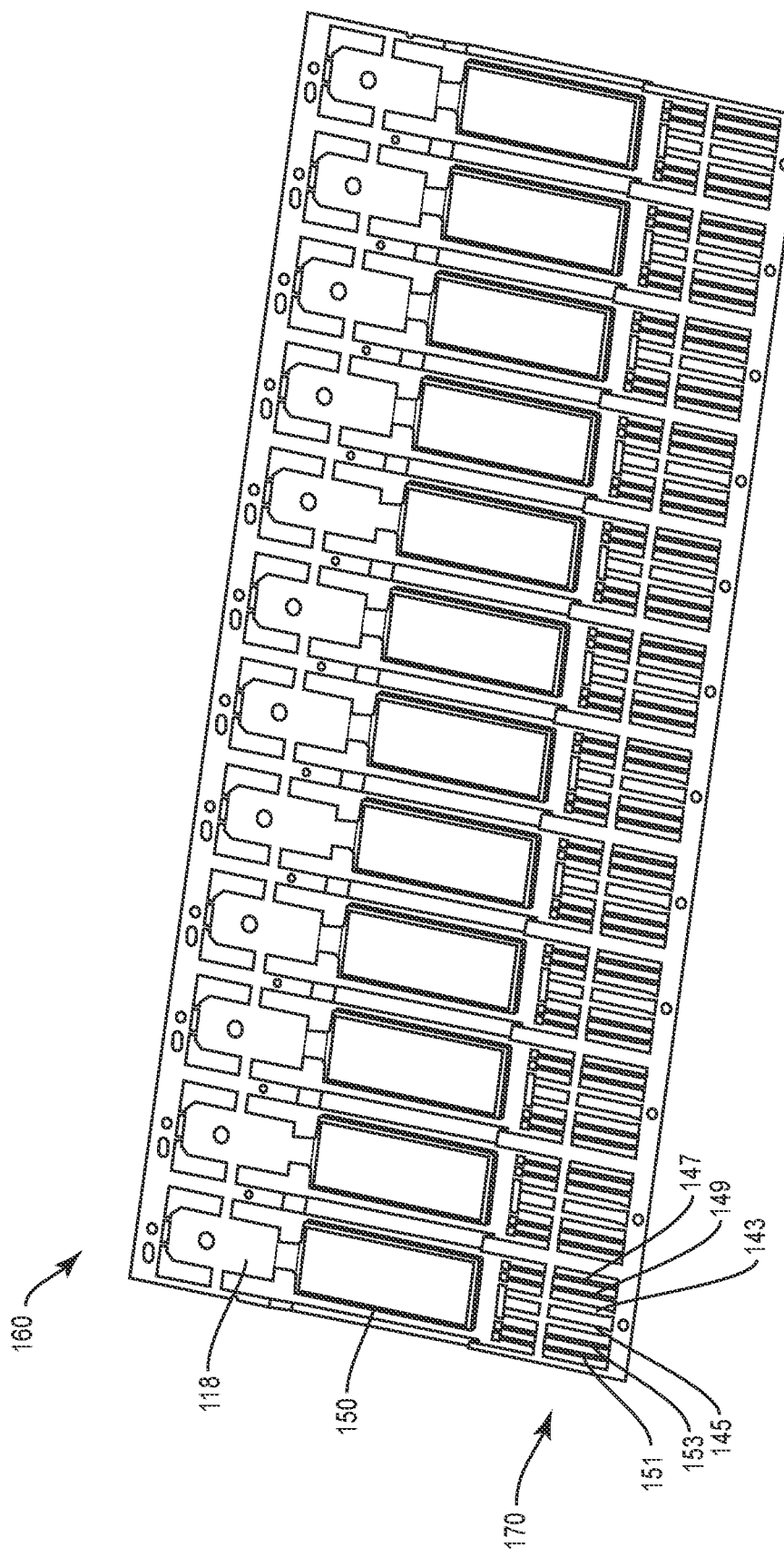

Referring to FIG. 12A, a first lead frame strip 160 is provided. The first lead frame strip 160 comprises a plurality of unit lead frames, wherein each unit lead frame comprises a first die pad 150 and a first row 170 of leads that each extend away from the first die pad 150. The first row 170 of leads comprises six leads in total, with first and second leads 143, 145 that are centrally located within the first row 170 and being wider than the outer leads. Third and fourth leads 147, 149 from the first row 170 are disposed on one side of the first and second leads 143, 145, and fifth and sixth leads 151, 153 from the first row 170 are disposed on the second side of the first and second leads. The unit lead frames additionally comprise a comprise a planar tab 118 and a perforation 120 with a similar configuration as previously described that is continuously connected to the first die pad 150. The first lead frame strip 160 may be provided by a dual gauge sheet of metal, e.g., as shown in FIG. 12B, that comprises a thicker central portion and a thinner outer portion. The thicker central portion may correspond to the first die pad 150 and the thinner outer portion may correspond to the first row 170 of leads and the planar tab 118.

Figure 12C:
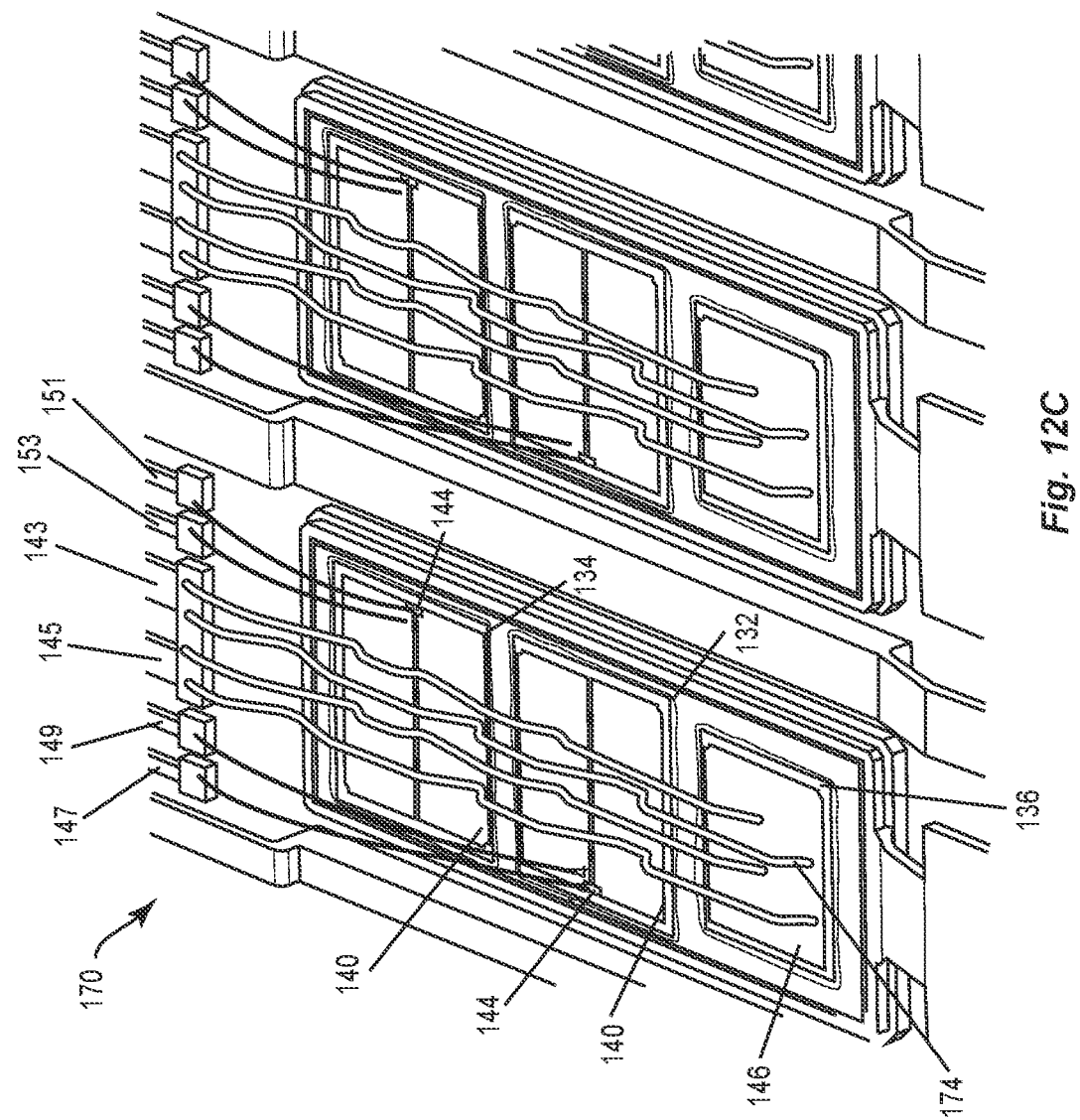

Referring to FIG. 12C, die mounting and wire bonding steps are performed. Each of the first and second discrete transistor dies 132, 134 and the first discrete diode die 136 are mounted on the first die pad 150 in a similar manner as previously described. The first and second discrete transistor dies 132, 134 and the first discrete diode die 136 may have the same terminal arrangement as previously described with reference to FIG. 10. The electrical connections of the various terminals of the first and second discrete transistor dies 132, 134 and the first discrete diode die 136 may be effectuated by bond wires 174 in a similar manner as previously described with reference to FIG. 10.

Figure 12D:
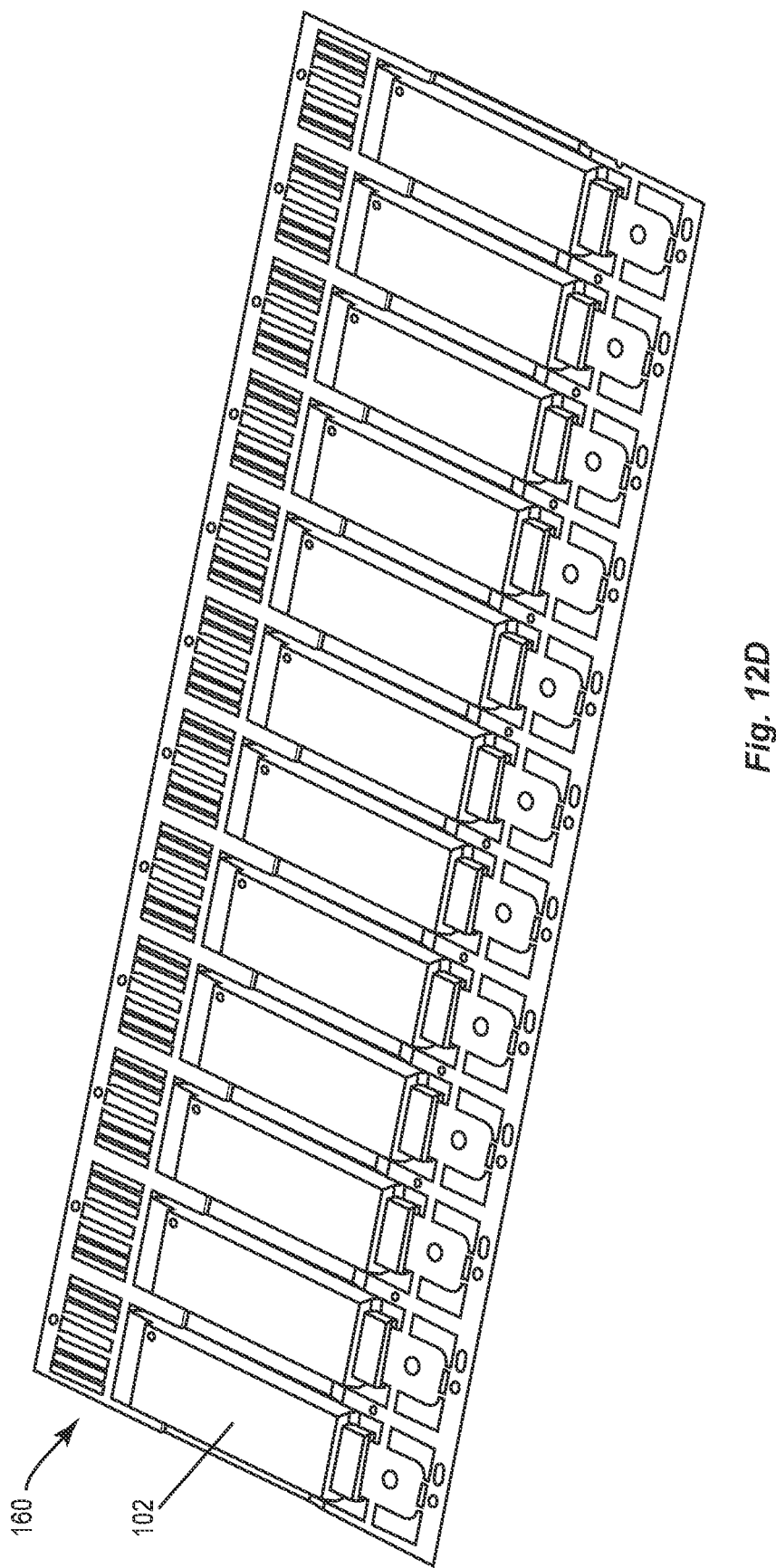

Referring to FIG. 12D, a molding process is performed to form the encapsulant body 102 of the semiconductor package 100 in a similar manner as previously described.

Figure 13A:
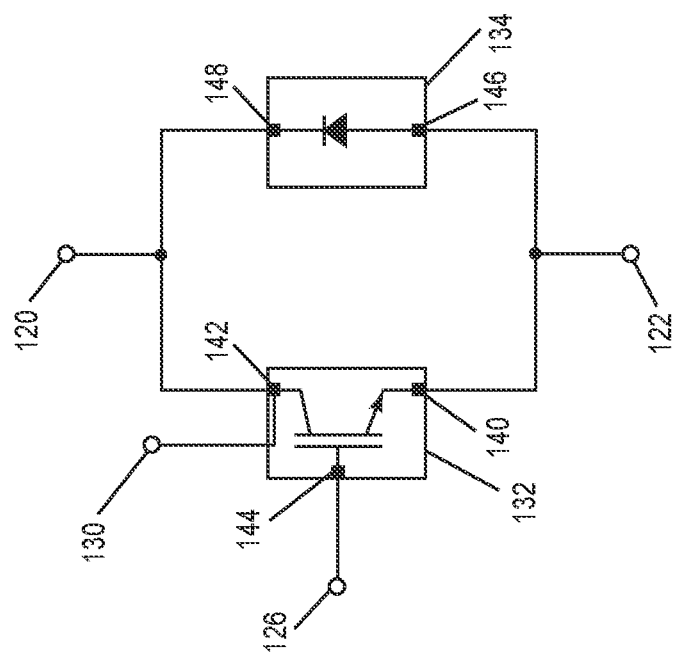
FIGS. 13A-13C, illustrates a semiconductor package that is configured as a discrete switching device, according to an embodiment.
Figure 13C:
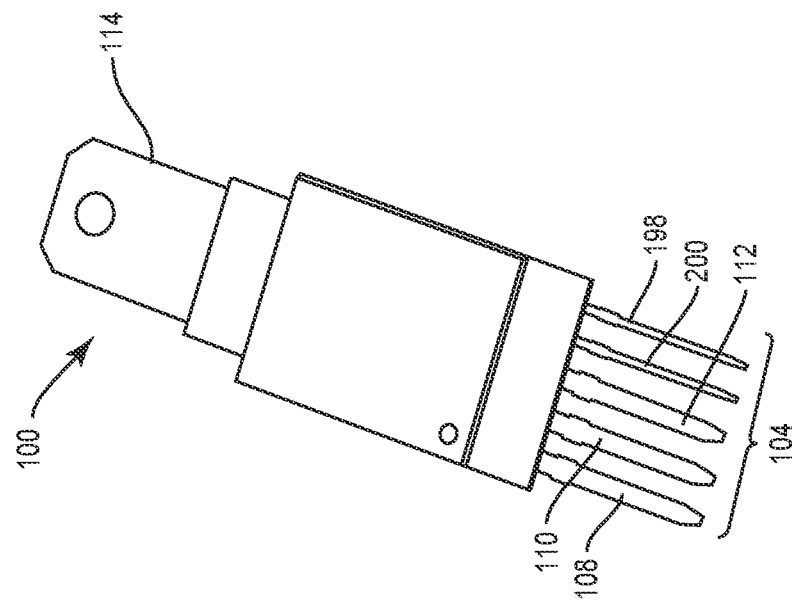

Referring to FIG. 13, a semiconductor package 100 that comprises a single switching device is depicted, according to an embodiment. Referring to FIG. 13A, the equivalent circuit of the semiconductor package 100 is identical to the schematic described with reference to FIG. 13A, except that the second discrete transistor die 134 and the corresponding terminals associated with the second discrete transistor die 134, i.e., the second control terminal 194 and the second sense terminal 196 have been omitted. Thus, the circuit utilizes a single first discrete transistor die 132 to control the load voltage and operational current.

Figure 13B:
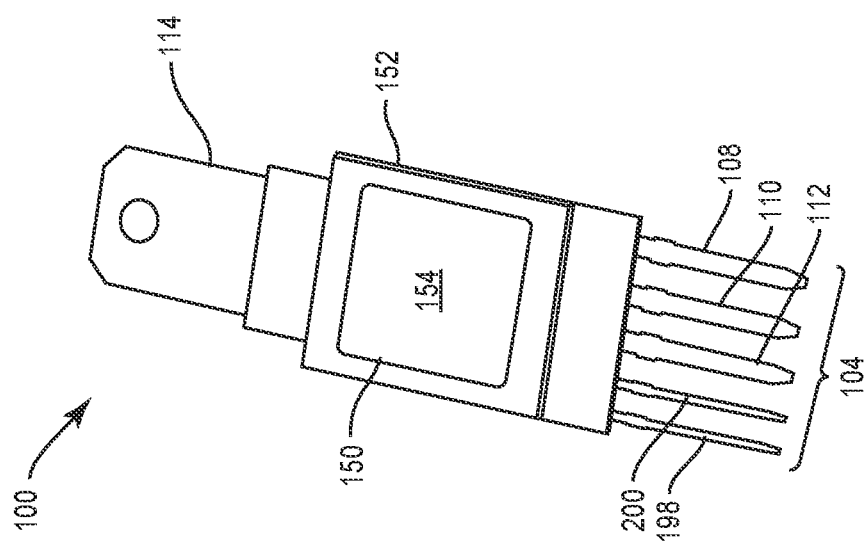

Referring to FIG. 13B, the semiconductor package 100 comprises five package leads 104 protruding out from the first outer face 106 of the encapsulant body 102, namely, a first package lead 108, a second package lead 110 a third package lead 112, a fourth package lead 198, and a fifth package lead 200, and comprises a connection lug 114 protruding out from the second outer face 116 of the encapsulant body 102. The semiconductor package 100 may have the following correspondence to the circuit described with reference to FIG. 13A. The connection lug 114 may correspond to the second load terminal 124, the first, second and third package leads 108, 110, 112 may each correspond to the first load terminal 122, the fourth package lead 198 may correspond to the first control terminal 126, and the fifth package lead 200 may correspond to the first sense terminal 130.

Referring to FIG. 14, selected processing steps for forming the semiconductor package 100 described with reference to FIG. 13 are depicted, according to an embodiment. In addition to the steps discussed below with reference to FIG. 14, the processing steps of FIG. 14 may include any of the processing steps for forming the semiconductor package 100 described herein, except where inconsistent with the discussion with reference to FIG. 14.

Figure 14A:
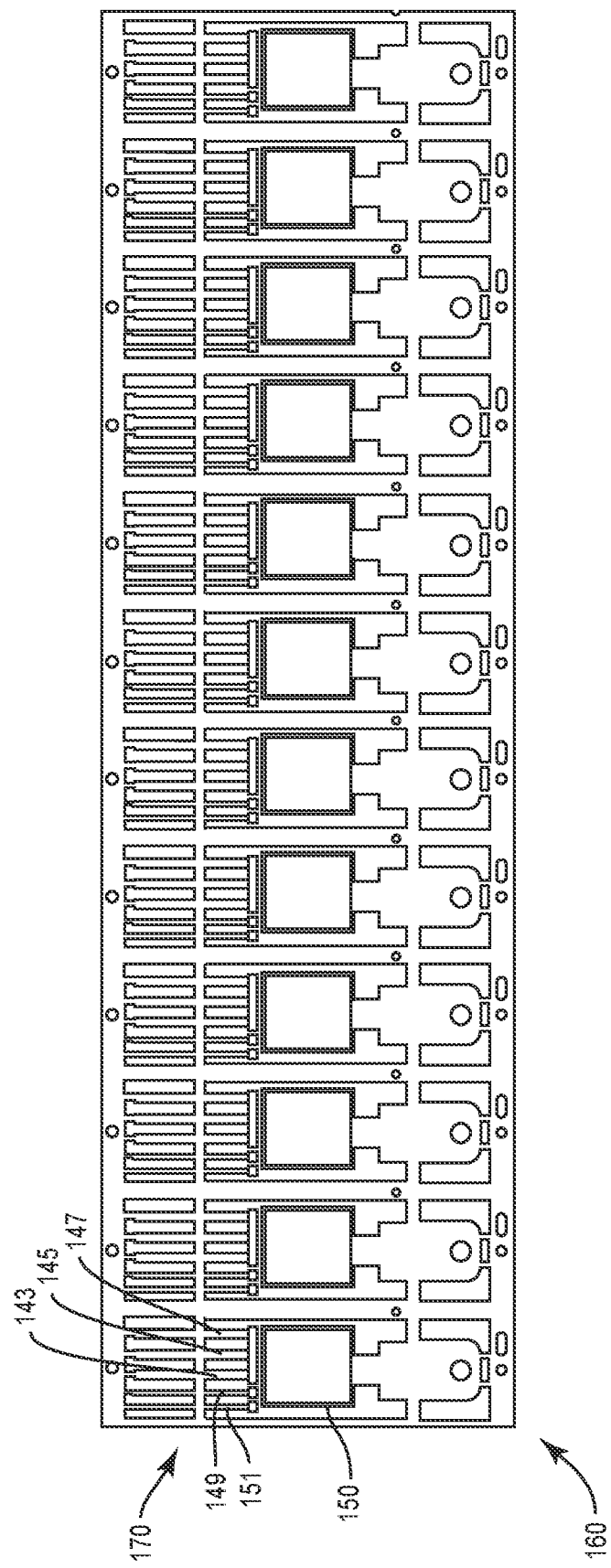
FIGS. 14A-14C, illustrates selected method steps for forming a semiconductor package, according to an embodiment.

Referring to FIG. 14A, a first lead frame strip 160 is provided. The first lead frame strip 160 comprises a plurality of unit lead frames, wherein each unit lead frame comprises a first die pad 150 and a first row 170 of leads that each extend away from the first die pad 150. The first lead frame strip 160 may have the same basic configuration as the first lead frame strip 160 described with reference to FIG. 12A, except that the size of the first die pad 150 may be made smaller to reflect the fact that fewer dies can be mounted thereon.

Figure 14B:
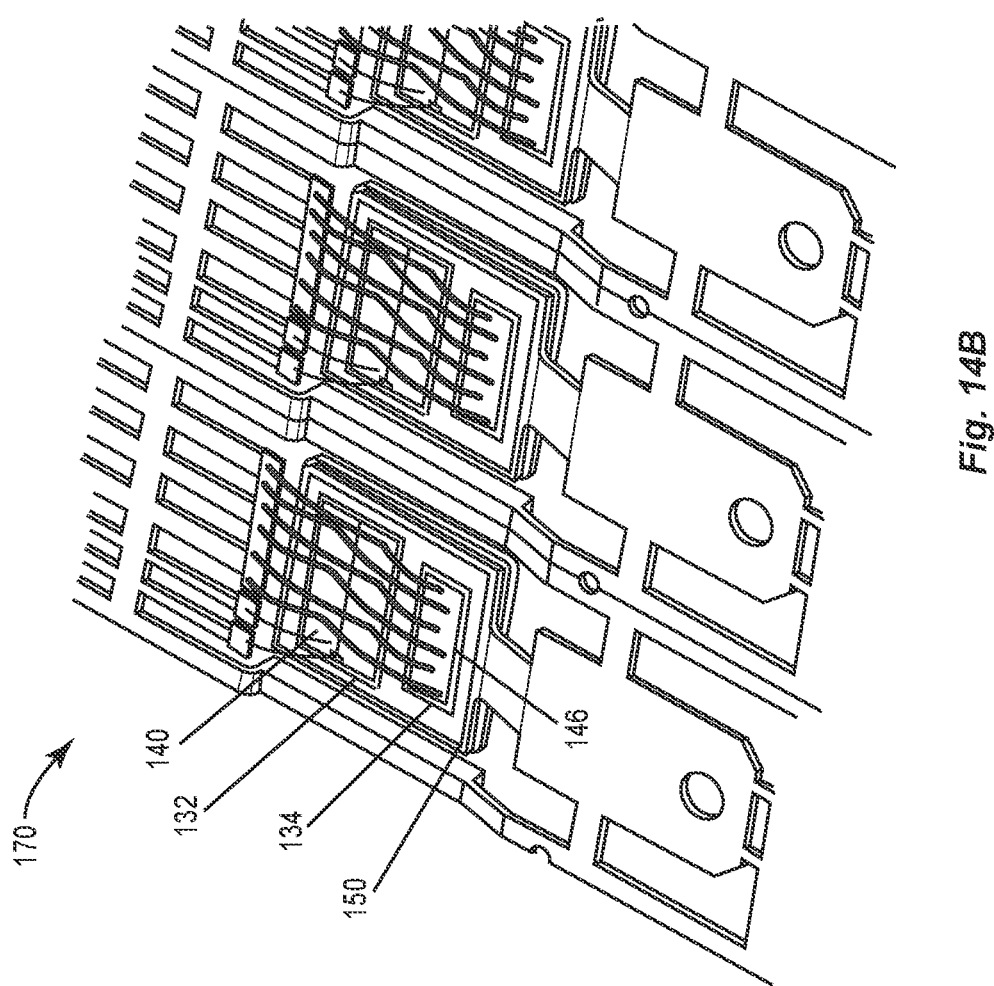

Referring to FIG. 14B, die mounting and wire bonding steps are performed. The first discrete transistor dies 132 and the first discrete diode die 136 are mounted on the first die pad 150 in a similar manner as previously described. The first discrete transistor dies 132 and the first discrete diode dies 136 may have the same terminal arrangement as previously described with reference to FIGS. 11 and 13. The electrical connections of the various terminals of the first and second discrete transistor dies 132, 134 and the first discrete diode die 136 may be effectuated by bond wires 174 in a similar manner as previously described with reference to FIG. 12, except that the connections to the second discrete diode die 138 are omitted. As shown, the first lead frame strip 160 may be configured to comprise a common landing pad that is connected with each of the first, second and third leads 143, 145, 147 from the first row 170 such that the first, second and third package leads 108, 110, 112 are each connected one another.

Figure 14C:
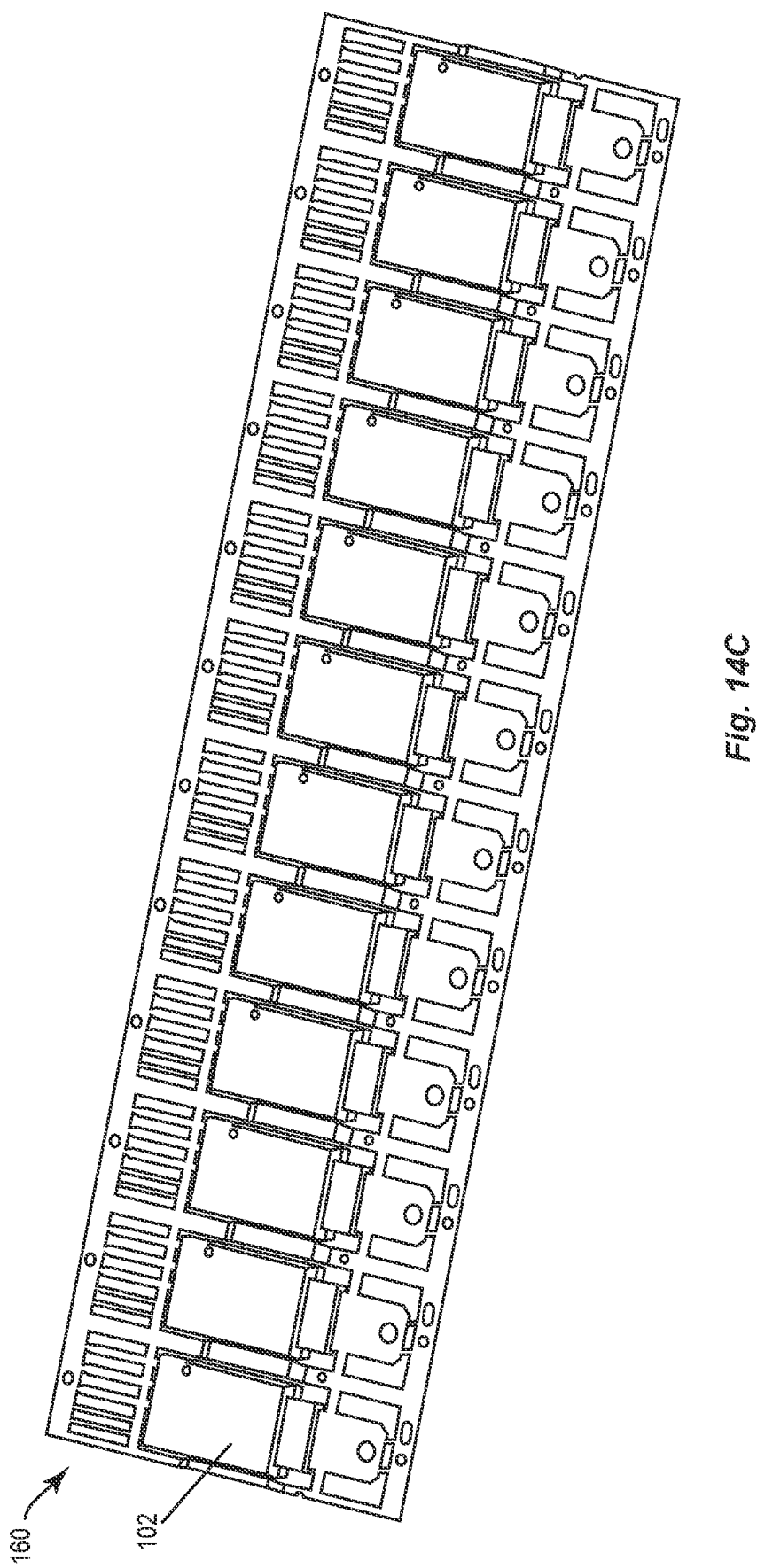

Referring to FIG. 14C, a molding process is performed to form the encapsulant body 102 of the semiconductor package 100 in a similar manner as previously described.

Embodiments of a semiconductor package that comprises one or more semiconductor dies are described herein. Generally speaking, the one or more semiconductor dies of the semiconductor package can have a wide variety of device configurations. Examples of these device configurations include discrete devices such as transistors or diodes, and integrated devices such as logic devices, controllers, sensors, etc. These devices may be made from type IV semiconductor technology, e.g., silicon, silicon germanium, silicon carbide, etc., and type III-V semiconductor technology, e.g., gallium nitride, gallium arsenide, etc. These devices can be configured as a vertical device wherein the conduction path vertically extends between a first load terminal that is disposed on a main surface and a second load terminal that is disposed on a rear surface opposite the main surface. These devices can be configured as a lateral device wherein each terminal of the die is disposed on a single main surface and the device is configured to conduct in a lateral direction that is parallel to this main surface.

Although the above embodiments refer to a semiconductor package that is configured a discrete power transistor, the structures, methods and concepts described herein are more generally applicable to a variety of different package types. In particular, the structures, methods and concepts described herein can applied to multi-die semiconductor packages, to semiconductor packages with separated die pads, to semiconductor packages configured as power converter circuits, e.g., half-bridge or boost converter, to rectifier bridges, or to six pack configurations.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

In the above description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
   a first die pad;
   a first semiconductor die mounted on the first die pad;
   an encapsulant body of electrically insulating material that encapsulates first die pad and the first semiconductor die;
   a plurality of package leads that each protrude out of a first outer face of the encapsulant body;
   a connection lug that protrudes out of a second outer face of the encapsulant body, the second outer face being opposite from the first outer face,
   wherein the first semiconductor die comprises first and second voltage blocking terminals,
   wherein the connection lug is electrically connected to one of the first and second voltage blocking terminals of the first semiconductor die, and
   wherein a first one of the package leads is electrically connected to an opposite one of the first and second voltage blocking terminals of the first semiconductor die that the first connection lug is electrically connected to.

2. The semiconductor package of claim 1, wherein the connection lug comprises a planar tab that is exposed from the encapsulant body and a perforation in the planar tab.

3. The semiconductor package of claim 1, wherein the semiconductor package further comprises a second semiconductor die, wherein the second semiconductor die comprises first and second voltage blocking terminals, wherein the connection lug is electrically connected to one of the first and second voltage blocking terminals of the second semiconductor die, and wherein the first package lead is electrically connected to an opposite one of the first and second voltage blocking terminals of the second semiconductor die that the first connection lug is electrically connected to.

4. The semiconductor package of claim 3, further comprising a second die pad, wherein the second semiconductor die is mounted on the second die pad, wherein the first and second semiconductor dies are arranged between the first and second die pads such that the front surface of the first semiconductor die faces the front surface of the second semiconductor die.

5. The semiconductor package of claim 4, wherein the connection lug is continuously connected to a metal clip segment that is arranged between the first and second semiconductor dies, wherein the connection lug is electrically connected to the second voltage blocking terminals of the first and second semiconductor dies via the metal clip segment, and wherein the first package lead is electrically connected to the first voltage blocking terminals of the first and second semiconductor dies.

6. The semiconductor package of claim 5, wherein the first and second semiconductor dies each further comprise a gate terminal, wherein the plurality of package leads further comprise a second package lead and a third package lead, wherein the second package lead is electrically connected to the gate terminals of the first and second semiconductor dies, and wherein the third package lead is electrically connected to the second voltage blocking terminals of the first and second semiconductor dies.

7. The semiconductor package of claim 5, wherein the first and second semiconductor dies each further comprise a gate terminal, wherein the plurality of package leads further comprise a second package lead, a third package lead, a fourth package lead, and a fifth package lead, wherein the second package lead is electrically connected to the gate terminal of the first semiconductor die, wherein the third package lead is electrically connected to the second voltage blocking terminal of the first semiconductor die, wherein the fourth package lead is electrically connected to the gate terminal of the second semiconductor die, and wherein the fifth package lead is electrically connected to the second voltage blocking terminal of the second semiconductor die.

8. The semiconductor package of claim 4, wherein the first and second semiconductor dies each further comprise a gate terminal, wherein the plurality of package leads further comprise a second package lead, a third package lead, a fourth package lead, a fifth package lead, and a sixth package lead, wherein the connection lug is electrically connected to the first voltage blocking terminal of the first semiconductor die via the first die pad and is electrically connected to the first voltage blocking terminal of the second semiconductor die via the second die pad, wherein the first and second package leads are electrically connected to the second voltage blocking terminals of the first and second semiconductor dies, wherein the third package lead is electrically connected to the gate terminal of the first semiconductor die, wherein the fourth package lead is electrically connected to the second voltage blocking terminal of the first semiconductor die, wherein the fifth package lead is electrically connected to the gate terminal of the second semiconductor die, and wherein the sixth package lead is electrically connected to the second voltage blocking terminal of the second semiconductor die.

9. The semiconductor package of claim 3, wherein the second semiconductor die is mounted on the first die pad adjacent to the first semiconductor die, wherein the first connection lug is continuously connected to the first die pad, and wherein the connection lug is electrically connected to the first voltage blocking terminals of each of the first and second semiconductor dies via the first die pad.

10. The semiconductor package of claim 1, wherein the first semiconductor die is a discrete power device that is rated to block at least 100 V between the first and second voltage blocking terminals of the first semiconductor die.

11. A semiconductor package, comprising:
a first discrete transistor die;
an encapsulant body of electrically insulating material that encapsulates the first discrete transistor die;
a plurality of package leads that each protrude out of a first outer face of the encapsulant body;
a connection lug that protrudes out of a second outer face of the encapsulant body, the second outer face being opposite from the first outer face,
wherein the first discrete transistor die is an IGBT die or a MOSFET die,
wherein in the case that the first discrete transistor die is an IGBT die, the connection lug is electrically connected to a emitter terminal of the first discrete transistor die and a first one of the package leads is electrically connected to a collector terminal of the first discrete transistor die, or
wherein in the case that the first discrete transistor die is a MOSFET die, the connection lug is electrically connected to a source terminal of the first discrete transistor die and a first one of the package leads is electrically connected to a drain terminal of the first discrete transistor die.

12. The semiconductor package of claim 11, wherein the semiconductor package further comprises a first die pad, wherein the first discrete transistor die is mounted on the first die pad, and wherein an outer surface of the first die pad is exposed from a third outer face of the encapsulant body.

13. The semiconductor package of claim 12, wherein the semiconductor package further comprises a second discrete transistor die, wherein the second discrete transistor die is an IGBT die or a MOSFET die, wherein in the case that the second discrete transistor die is an IGBT die, the connection lug is electrically connected to a emitter terminal of the second discrete transistor die and the first package lead is electrically connected to a collector terminal of the second discrete transistor die, or wherein in the case that the first second transistor die is a MOSFET die, the connection lug is electrically connected to a source terminal of the second discrete transistor and the first package lead is electrically connected to a drain terminal of the second discrete transistor die.

14. The semiconductor package of claim 13, wherein the semiconductor package further comprises a second die pad, wherein the second discrete transistor die is mounted on the second die pad, and wherein an outer surface of the second die pad is exposed from a fourth outer face of the encapsulant body that is opposite from the third outer face of the encapsulant body.

15. The semiconductor package of claim 13, wherein the second discrete transistor die is mounted on the first die pad.

16. A semiconductor package, comprising:
a first discrete transistor die;
an encapsulant body of electrically insulating material that encapsulates the first discrete transistor die;
a plurality of package leads that each protrude out of a first outer face of the encapsulant body;
a connection lug that protrudes out of a second outer face of the encapsulant body, the second outer face being opposite from the first outer face,
wherein the first discrete transistor die is an IGBT die or a MOSFET die,
wherein in the case that the first discrete transistor die is an IGBT die, the connection lug is electrically connected to a collector terminal of the first discrete transistor die and a first one of the package leads is electrically connected to an emitter terminal of the first discrete transistor die, or
wherein in the case that the first discrete transistor die is a MOSFET die, the connection lug is electrically connected to a drain terminal of the first discrete transistor die and a first one of the package leads is electrically connected to a source terminal of the first discrete transistor die.

17. The semiconductor package of claim 16, wherein the semiconductor package further comprises a first die pad, wherein the first discrete transistor die is mounted on the first die pad, and wherein an outer surface of the first die pad is exposed from a third outer face of the encapsulant body.

18. The semiconductor package of claim 17, wherein the semiconductor package further comprises a second discrete transistor die, wherein the second discrete transistor die is an IGBT die or a MOSFET die, wherein in the case that the second discrete transistor die is an IGBT die, the connection lug is electrically connected to a collector terminal of the second discrete transistor die and the first package lead is electrically connected to an emitter terminal of the second discrete transistor die, or wherein in the case that the first second transistor die is a MOSFET die, the connection lug is electrically connected to a drain terminal of the second discrete transistor and the first package lead is electrically connected to a source terminal of the second discrete transistor die.

19. The semiconductor package of claim 18, wherein the semiconductor package further comprises a second die pad, wherein the second discrete transistor die is mounted on the second die pad, and wherein an outer surface of the second die pad is exposed from a fourth outer face of the encapsulant body that is opposite from the third outer face of the encapsulant body.

20. The semiconductor package of claim 18, wherein the second discrete transistor die is mounted on the first die pad.

* * * * *

UNITED STATES PATENT AND TRADEMARK OFFICE
CERTIFICATE OF CORRECTION

PATENT NO. : 11,728,250 B2
APPLICATION NO. : 17/325422
DATED : August 15, 2023
INVENTOR(S) : E. Fuergut et al.

Page 1 of 1

It is certified that error appears in the above-identified patent and that said Letters Patent is hereby corrected as shown below:

On the Title Page

Item (57) Abstract, Lines 3-4, please change "encapsulates first" to -- encapsulates the first --

In the Claims

Column 22, Line 22 (Claim 1, Line 5), please change "encapsulates first" to -- encapsulates the first --

Signed and Sealed this
Twenty-sixth Day of September, 2023

Katherine Kelly Vidal
*Director of the United States Patent and Trademark Office*